United States Patent
Yamagajo et al.

(10) Patent No.: US 9,223,908 B2
(45) Date of Patent: Dec. 29, 2015

(54) ANTENNA DESIGNING METHOD AND APPARATUS

(71) Applicant: FUJITSU LIMITED, Kawasaki-shi (JP)

(72) Inventors: Takashi Yamagajo, Yokosuka (JP); Tabito Tonooka, Kawasaki (JP); Masaki Tosaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 309 days.

(21) Appl. No.: 13/686,387

(22) Filed: Nov. 27, 2012

(65) Prior Publication Data

US 2013/0173234 A1 Jul. 4, 2013

(30) Foreign Application Priority Data

Dec. 28, 2011 (JP) ................. 2011-289700

(51) Int. Cl.
G06F 17/50 (2006.01)
G06G 7/48 (2006.01)

(52) U.S. Cl.
CPC ........ *G06F 17/5009* (2013.01); *G06F 17/5036* (2013.01); *G06F 17/5063* (2013.01)

(58) Field of Classification Search
None
See application file for complete search history.

(56) References Cited

U.S. PATENT DOCUMENTS

| | | | |
|---|---|---|---|
| 5,719,794 A * | 2/1998 | Altshuler et al. | 703/1 |
| 6,753,814 B2 | 6/2004 | Killen et al. | |
| 6,943,731 B2 | 9/2005 | Killen et al. | |
| 8,120,542 B2 | 2/2012 | Shoji | |
| 8,121,821 B1 * | 2/2012 | Jones | 703/1 |
| 8,164,529 B2 | 4/2012 | Parsche et al. | |
| 2005/0107042 A1 | 5/2005 | De Graauw | |
| 2008/0136728 A1 | 6/2008 | Banba | |
| 2010/0094445 A1 * | 4/2010 | Noh et al. | 700/97 |
| 2010/0109957 A1 * | 5/2010 | Moon et al. | 343/703 |
| 2013/0006585 A1 * | 1/2013 | Simon | 703/1 |

FOREIGN PATENT DOCUMENTS

| | | |
|---|---|---|
| JP | 2000-078032 | 3/2000 |
| JP | 2004-32776 | 1/2004 |
| JP | 2005-516525 | 6/2005 |
| JP | 2006-522548 | 9/2006 |
| JP | 2008-085987 | 4/2008 |
| JP | 2008-306552 | 12/2008 |
| JP | 2010-62976 | 3/2010 |
| JP | 2010-98742 | 4/2010 |

OTHER PUBLICATIONS

"An Interconnecting Technology for RF MEMS nHeterogeneous Chip Integration", Chao et al. IEEE Transactions on Electron Devices, vol. 57, No. 4, Apr. 2010.*
JPOA—Office Action dated May 19, 2015 for corresponding Japanese Patent Application No. 2011-289700, with English Translation of the relevant parts, p. 1, line 22-p. 2, line 6 and p. 2, lines 14-16 of the Office Action.

* cited by examiner

Primary Examiner — Omar Fernandez Rivas
Assistant Examiner — Nithya J Moll
(74) Attorney, Agent, or Firm — Fujitsu Patent Center

(57) ABSTRACT

An antenna designing method, performed by a computer, includes: inputting a first antenna characteristic of an antenna; creating an antenna model that includes the antenna and a matching circuit which is connected to the antenna and is formed by a matching element including parasitic reactance and loss resistance; calculating a second antenna characteristic of the created antenna model by using the first antenna characteristic; determining whether or not the calculated second antenna characteristic satisfies a desired standard value; and displaying a determined result.

7 Claims, 23 Drawing Sheets

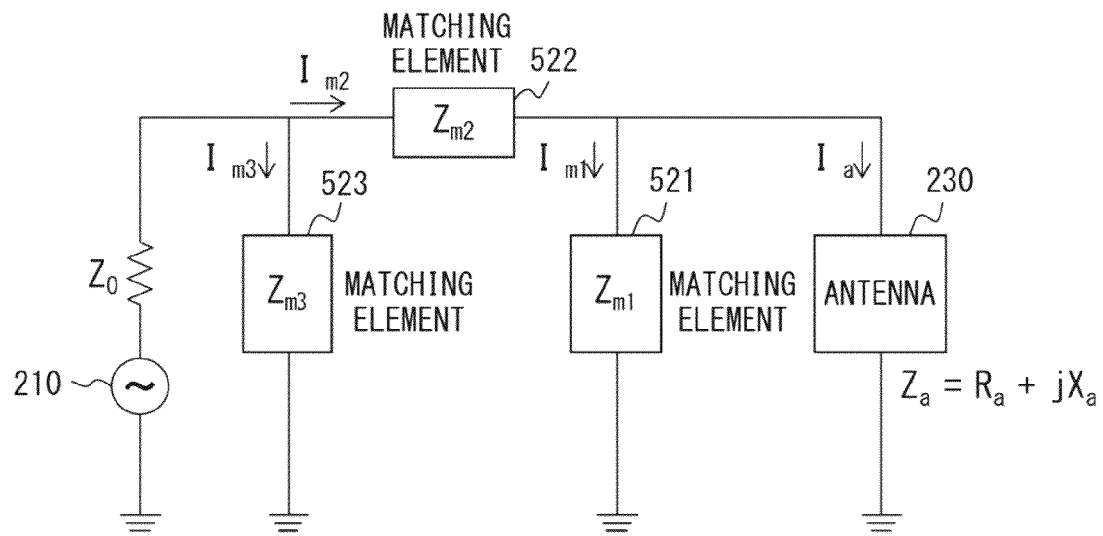
F I G. 6

| | | | Behavior |
|---|---|---|---|
| $a\beta - b\alpha > 0$ | $-\frac{(a\gamma - c\alpha)^2}{a\beta - b\alpha} + b\gamma - c\beta < 0$ | $\frac{a\gamma - c\alpha - \sqrt{(a\gamma - c\alpha)^2 - (a\beta - b\alpha)(b\gamma - c\beta)}}{a\beta - b\alpha} > 0$ | As $R_m$ becomes larger, $S_{11}$ becomes worse, improves, and then becomes worse |
| | | $\frac{a\gamma - c\alpha - \sqrt{(a\gamma - c\alpha)^2 - (a\beta - b\alpha)(b\gamma - c\beta)}}{a\beta - b\alpha} < 0$ かつ $\frac{a\gamma - c\alpha + \sqrt{(a\gamma - c\alpha)^2 - (a\beta - b\alpha)(b\gamma - c\beta)}}{a\beta - b\alpha} > 0$ | As $R_m$ becomes larger, $S_{11}$ improves and then becomes worse |
| | | $\frac{a\gamma - c\alpha + \sqrt{(a\gamma - c\alpha)^2 - (a\beta - b\alpha)(b\gamma - c\beta)}}{a\beta - b\alpha} < 0$ | As $R_m$ becomes larger, $S_{11}$ becomes worse |
| | $-\frac{(a\gamma - c\alpha)^2}{a\beta - b\alpha} + b\gamma - c\beta > 0$ | — | As $R_m$ becomes larger, $S_{11}$ becomes worse |
| $a\beta - b\alpha < 0$ | $-\frac{(a\gamma - c\alpha)^2}{a\beta - b\alpha} + b\gamma - c\beta > 0$ | $\frac{a\gamma - c\alpha - \sqrt{(a\gamma - c\alpha)^2 - (a\beta - b\alpha)(b\gamma - c\beta)}}{a\beta - b\alpha} > 0$ | As $R_m$ becomes larger, $S_{11}$ improves, becomes worse, and then improves |
| | | $\frac{a\gamma - c\alpha - \sqrt{(a\gamma - c\alpha)^2 - (a\beta - b\alpha)(b\gamma - c\beta)}}{a\beta - b\alpha} < 0$ かつ $\frac{a\gamma - c\alpha + \sqrt{(a\gamma - c\alpha)^2 - (a\beta - b\alpha)(b\gamma - c\beta)}}{a\beta - b\alpha} > 0$ | As $R_m$ becomes larger, $S_{11}$ becomes worse and then improves |
| | | $\frac{a\gamma - c\alpha + \sqrt{(a\gamma - c\alpha)^2 - (a\beta - b\alpha)(b\gamma - c\beta)}}{a\beta - b\alpha} < 0$ | As $R_m$ becomes larger, $S_{11}$ improves |
| | $-\frac{(a\gamma - c\alpha)^2}{a\beta - b\alpha} + b\gamma - c\beta < 0$ | — | As $R_m$ becomes larger, $S_{11}$ improves |

FIG. 11

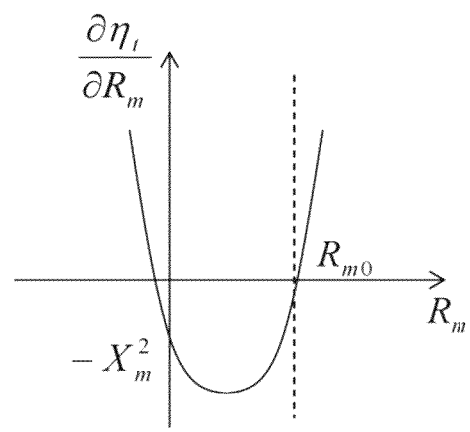
F I G. 13

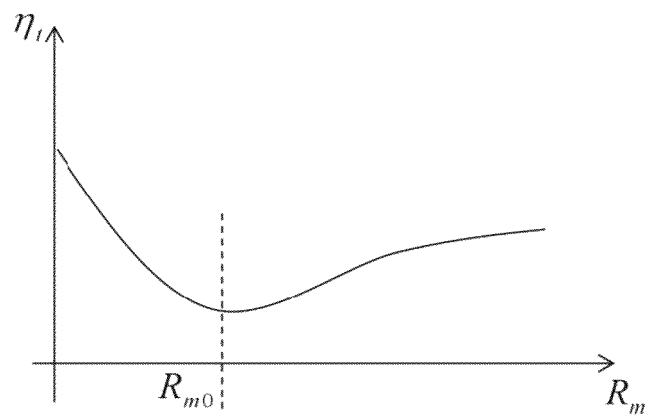
F I G. 14

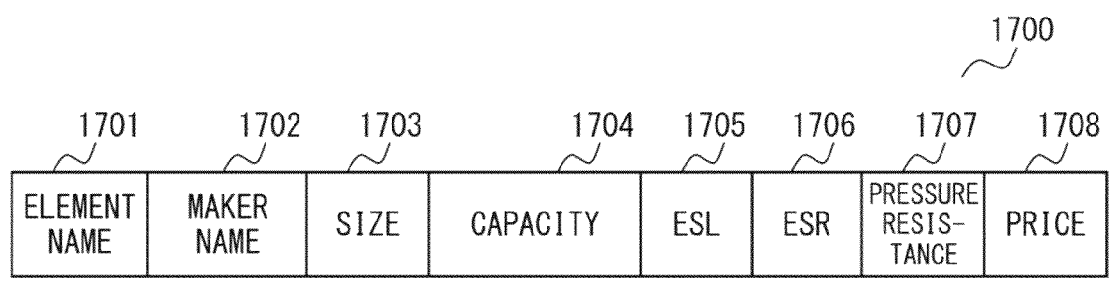
F I G. 17

| 1901 | 1902 | 1903 | 1904 | 1905 | 1906 | 1907 | 1908 |
|---|---|---|---|---|---|---|---|
| ELEMENT NAME | MAKER NAME | SIZE | INDUCTANCE | SUBSIDIARY C | SUBSIDIARY R | PRESSURE RESISTANCE | PRICE |

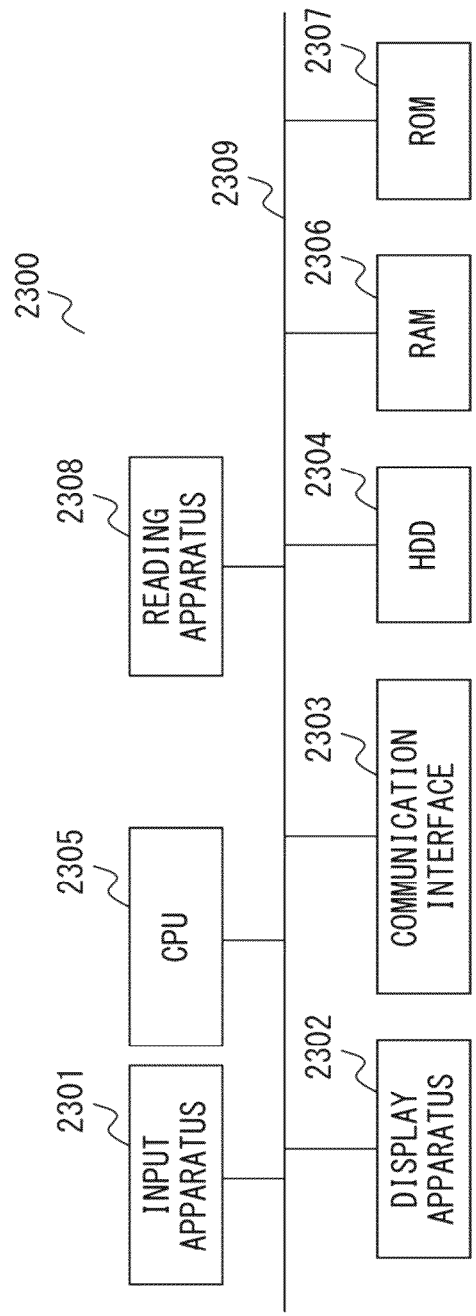
F I G. 23

ANTENNA DESIGNING METHOD AND APPARATUS

CROSS-REFERENCE TO RELATED APPLICATION

This application is based upon and claims the benefit of prior Japanese Patent Application No. 2011-289700, filed on Dec. 28, 2011, the entire contents of which are incorporated herein by reference.

FIELD

The embodiments described herein are related to an antenna designing method, an antenna designing apparatus, and an antenna designing program.

BACKGROUND

The following processes are performed when an antenna installed in a transmitting/receiving apparatus such as a hand-held terminal apparatus is designed.

First, an antenna model which does not include a matching circuit is created, and antenna characteristics such as the antenna impedance and the voltage standing wave ratio (VSWR) of the created antenna model are calculated in a simulation.

Next, it is determined whether or not the voltage standing wave ratio of the calculated antenna model satisfies a desired standard.

When it is determined that the desired standard is not satisfied, a model of a mating circuit is created with reference to the calculated antenna impedance, and the created matching circuit is added to the antenna model. For the antenna model to which the matching circuit has been added, an antenna characteristic such as a voltage standing wave ratio is calculated in a simulation, and it is evaluated whether or not the calculated antenna characteristic satisfies the desired standard.

When it is evaluated that the calculated antenna characteristic satisfies the desired standard, the designing of the antenna ends. By contrast, when it is evaluated that the calculated antenna characteristic does not satisfy the desired standard, the process returns to the configuring of a matching circuit, and the antenna designing continues.

A prior art exists wherein the radiation characteristic of a patch antenna is measured using predetermined parameters, including, for example, the conductivity of a transparent conductive film that functions as a radiating element and the conductivity of a microstripline.

A prior art exists wherein the radiant efficiencies of a matching element and an antenna of a transmission and/or reception module are measured.

A prior art exists wherein, for a notch antenna including a reactive circuit, a relationship between a frequency and a return loss and a relationship between a frequency and an antenna efficiency are determined using an electromagnetic simulation such as a Finite Difference Time Domain Method (FTDT).

A prior art exists wherein a relationship is examined between the dielectric constant of a dielectric space between a radiation antenna element and a feedline and the radiant efficiency of a microstrip slot antenna.

A prior art exists wherein the radiation resistance of a dipole antenna system is calculated from an approximation formula using radiation resistance, inductive reactance, capacitive reactance, ohmic feed point ground loss, and a skin effect.

A prior art exists wherein the radiant efficiency of a loop antenna is calculated from the radiation resistance of the loop antenna and the resistance loss of a conductor forming the loop antenna.

In recent years, the size and thickness of hand-held terminal apparatuses have been decreased, thereby decreasing the size and thickness of a space for installing an antenna to be provided for the hand-held terminal apparatuses. As a result, when, for example, a hand-held terminal apparatus including a sliding mechanism for slidably attaching a cover to the body of the hand-held terminal uses a metal as the sliding mechanism, the antenna might be located near the metal. If a metal is near an antenna, a current that cancels an antenna current will flow through the metal and the antenna performance will thus be degraded.

Performance measures of an antenna include radiation resistance $R_r$. Assuming that loss resistance included in, for example, an antenna, a matching circuit, and a feedline is $R_l$, radiation efficiency $\eta$, which is the ratio between actual electric power applied to the antenna and electric power radiated from the antenna, is expressed by the following formula.

$$\eta = \frac{R_r}{R_r + R_l} \quad \text{[Formula 1]}$$

As is clear from formula (1), when radiation resistance $R_r$ of the antenna is small, radiation efficiency $\eta$ is degraded remarkably even if loss resistance $R_l$ is a small value. Accordingly, the antenna is desirably designed in such a manner that radiation resistance $R_r$ becomes large.

However, in the case of a thin and small hand-held terminal apparatus, since a metal could be close to the antenna as described above, it could be difficult to radiate radio waves, i.e., radiation resistance $R_r$ could become small. Accordingly, in order to design an antenna with a small radiation resistance $R_r$, attention needs to be paid to loss resistance $R_l$ even when this loss resistance $R_l$ is a small value.

In the case of an antenna with a low radiation resistance $R_r$, when input impedance deviates from a characteristic impedance (e.g., 50Ω), matching needs to be achieved by a matching circuit.

A matching element forming the matching circuit includes a small number of resistance components in addition to a capacitance component or an inductance component. Accordingly, when the matching circuit is provided between an antenna and a transmitter and receiver module and when a current flows through the matching circuit, the resistance components of the matching element forming the matching circuit could form loss resistance $R_l$. As a result, when radiation resistance $R_r$ of the antenna is small, even if matching is achieved by the matching circuit, an antenna characteristic such as radiation efficiency $\eta$ of the antenna could possibly not satisfy a standard due to the influence of the resistance components of the matching element.

Accordingly, in order to design an antenna with a small radiation resistance $R_r$, antenna characteristics need to be calculated in consideration of a loss resistance component in addition to a capacitance component or inductance component and a parasitic inductance component or parasitic capacitance component of each matching element forming a matching circuit.

In this regard, when the aforementioned conventional antenna designing process is performed in consideration of a loss resistance component of a matching element, the following processes are performed.

First, a model of each component of a matching element forming a matching circuit is individually created in such a manner that the model includes a parasitic capacitance component or parasitic inductance component and a loss resistance component in addition to a capacitance component or inductance component. The value of each component of the created matching element is individually input and set. An antenna characteristic of an antenna model including the created matching circuit is calculated in a simulation.

Next, it is evaluated whether or not the calculated antenna characteristic satisfies a desired standard. When it is evaluated that the calculated antenna characteristic does not satisfy the desired standard, the process returns to the creating of the model of each component of the matching element forming the matching circuit, and the antenna designing process continues.

As described above, in the conventional antenna designing process, for a matching element forming a matching circuit, a model of each component needs to be individually created in such a manner that the model includes a parasitic capacitance component or parasitic inductance component and a loss resistance component in addition to a capacitance component or inductance component, and the value of each created component needs to be individually input. As a result, a process for creating an antenna model provided with a matching circuit and further including a parasitic capacitance component, a parasitic inductance component, and a loss resistance component included in a matching element becomes complicated.

Moreover, in the conventional antenna designing process, a matching circuit to be added to an antenna needs to be configured by evaluating whether or not a simulation result conforms to a desired standard, and hence the matching circuit is unable to be determined efficiently.

PRIOR ART DOCUMENTS

Patent document 1: Japanese Laid-open Patent Publication No. 2008-306552
Patent document 2: Japanese National Publication of International Patent Application No. 2005-516525
Patent document 3: Japanese Laid-open Patent Publication No. 2010-62976
Patent document 4: Japanese National Publication of International Patent Application No. 2006-522548
Patent document 5: Japanese Laid-open Patent Publication No. 2004-32776
Patent document 6: Japanese Laid-open Patent Publication No. 2010-98742

SUMMARY

According to an aspect of the embodiments, an antenna designing method, performed by a computer, includes: inputting a first antenna characteristic of an antenna; creating an antenna model that includes the antenna and a matching circuit which is connected to the antenna and is formed by a matching element including parasitic reactance and loss resistance; calculating a second antenna characteristic of the created antenna model by using the first antenna characteristic; determining whether or not the calculated second antenna characteristic satisfies a desired standard value; and displaying a determined result.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is an equivalent circuit diagram representing the equivalent circuit illustrated in FIG. 5 using $Z_{m1}$, $Z_{m2}$ and $Z_{m3}$;

FIG. 11 illustrates relationships between loss resistance $R_m$ and reflection coefficient $S_{11}$ in a case in which one matching element is inserted in parallel as a matching circuit;

FIG. 13 illustrates a relationship between loss resistance $R_m$ and $\partial \eta_t / \partial R_m$ in a case in which one matching element is inserted in parallel as a matching circuit;

FIG. 14 illustrates a relationship between loss resistance $R_m$ and total efficiency $\eta_t$ in a case in which one matching element is inserted in parallel as a matching circuit;

FIG. 17 illustrates an example of a matching element data file in a situation in which the kind of a matching element is a capacitor;

FIG. 19 illustrates an example of a matching element data file in a situation in which the kind of a matching element is an inductor;

FIG. 23 is a hardware configuration diagram of a computer that executes an antenna designing program in accordance with an embodiment.

BRIEF DESCRIPTION OF EMBODIMENTS

In the following, embodiments will be described in detail with reference to the drawings.

Figure 1:
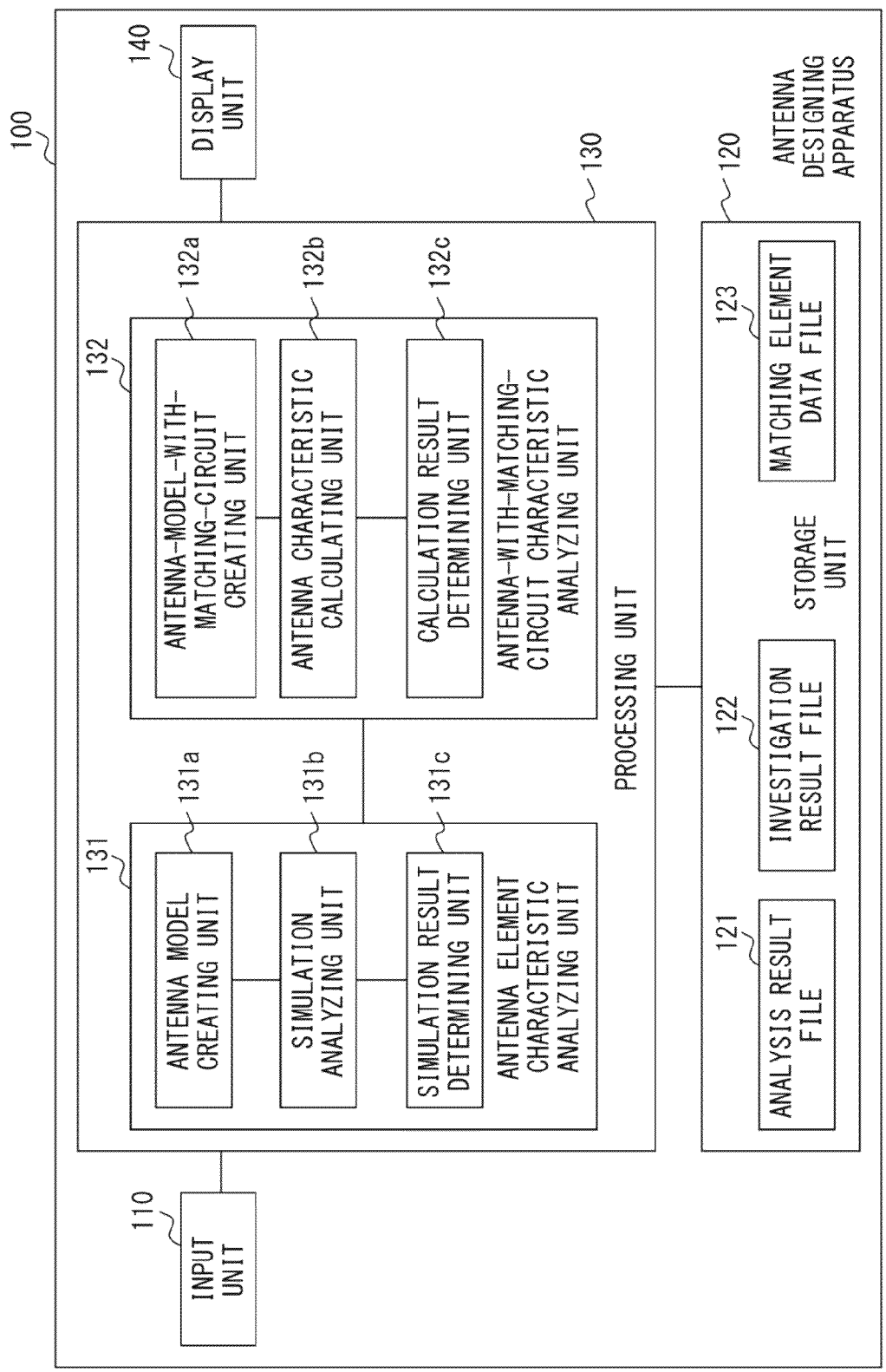
FIG. 1 is a functional configuration diagram illustrating an antenna designing apparatus in accordance with an embodiment.

FIG. 1 is a functional configuration diagram illustrating an antenna designing apparatus in accordance with an embodiment.

An antenna designing apparatus 100 includes an input unit 110, a storage unit 120, a processing unit 130, and a display unit 140.

The input unit 110 is an apparatus that inputs various pieces of data needed to design an antenna. The input unit 110 is, for example, a keyboard or a mouse.

Various pieces of data input by the input unit 110 include data relating to, for example, a shape of an antenna model, a material for a model, a wave source, a circuit component, an analysis condition, and an analysis output item.

Data relating to a material for a model relates to, for example, conductivity, a dielectric constant, permeability, and various losses. Data relating to an analysis condition relates to, for example, the upper limit and the lower limit of an analyzed frequency, a frequency pitch, and a presence/absence of a high-speed processing setting. Data relating to an analysis output item relates to, for example, radiation efficiency, total efficiency, antenna impedance, and an S parameter (Scattering parameter).

As will be described hereinafter with reference to FIG. 2, radiation efficiency indicates the ratio between actual electric power input to the antenna side at the position at which a matching circuit is inserted and radiated power from the antenna. However, for an antenna model that does not include a matching circuit, since a loss included in a matching circuit does not need to be considered, the radiation efficiency indicates the ratio between actual electric power input to an antenna and radiated power from the antenna.

Total efficiency indicates the ratio between all of the input electric power from a wave source and radiated power from an antenna.

The storage unit 120 is a storage apparatus that includes an analysis result file 121 and an investigation result file 122 in which processing data provided by the processing unit 130 is stored.

Depending on an embodiment, the storage unit 120 further includes a matching element data file 123. The matching element data file 123 stores, for example, various pieces of data on a matching element commercially available from a circuit components maker or the like. Examples of the various pieces of data stored on a matching element include data relating to, for example, the kind of a matching element, capacitance or inductance of the matching element, the size of the matching element, parasitic inductance or parasitic capacitance, loss resistance, a pressure resistance, and a price.

The storage unit 120 is, for example, a read only memory (ROM), a random access memory (RAM), and a hard disk drive (HDD).

The processing unit 130 is a processing apparatus that performs antenna designing in accordance with an embodiment. The processing unit 130 is, for example, a central processing unit (CPU).

The display unit 140 is an apparatus that displays a processing result provided by the processing unit 130. The display unit 140 is, for example, a liquid crystal display apparatus.

The processing unit 130 includes an antenna-element characteristic analyzing unit 131 and an antenna-with-matching-circuit characteristic analyzing unit 132 (i.e., a unit that analyzes a characteristic of an antenna provided with a matching circuit).

The antenna-element characteristic analyzing unit 131 analyzes, in a simulation, an antenna characteristic of an antenna model that does not include a matching circuit and that is created in accordance with input data from the input unit 110. In the following descriptions, an antenna characteristic of an antenna model that does not include a matching circuit is simply referred to as "an antenna characteristic of an antenna" in some cases.

The antenna-element characteristic analyzing unit 131 includes an antenna model creating unit 131a, a simulation analyzing unit 131b, and a simulation result determining unit 131c.

In accordance with input data from the input unit 110, the antenna model creating unit 131a creates an antenna model that does not include a matching circuit.

The simulation analyzing unit 131b analyzes, in a simulation, an antenna characteristic of the antenna model that does not include a matching circuit and that is created by the antenna model creating unit 131a.

The simulation performed by the simulation analyzing unit 131b is an electromagnetic field simulation employing, for example, a moment method, a finite element method, and a finite-difference time-domain method.

Antenna characteristics obtained via analyzing by the simulation analyzing unit 131b include radiation efficiency, antenna impedance, and an S parameter for each frequency, which is set via inputting by the input unit 110. These antenna characteristics are stored in the analysis result file 121 of the storage unit 120.

The simulation result determining unit 131c determines whether or not a voltage standing wave ratio obtained via analyzing by the simulation unit 131b is equal to or less than a desired standard value. The desired standard value of a voltage standing wave ratio is obtained by the simulation result determining unit 131c via, for example, an input by the input unit 110.

A determination result provided by the simulation result determining unit 131c is stored in the analysis result file 121.

The antenna-with-matching-circuit characteristic analyzing unit 132 analyzes an antenna characteristic of an antenna model provided with a matching circuit by using a calculation method in accordance with an embodiment.

The antenna-with-matching-circuit characteristic analyzing unit 132 performs analyzing when an antenna characteristic of an antenna model that does not include a matching circuit does not satisfy a desired standard value.

Depending on an embodiment, the antenna-with-matching-circuit characteristic analyzing unit 132 performs analyzing when a voltage standing wave ratio at a subject frequency exceeds a desired standard value as a result of a determination made by the simulation result determining unit 131c.

Depending on an embodiment, the antenna-with-matching-circuit characteristic analyzing unit 132 performs analyzing regardless of a determination result provided by the simulation result determining unit 131c. When, for example, an electromagnetic field simulator that does not include the antenna-element characteristic analyzing unit 131 creates an antenna model that does not include a matching circuit and an antenna characteristic of the created antenna model is obtained, the antenna-with-matching-circuit characteristic analyzing unit 132 performs analyzing using the obtained antenna characteristic.

The antenna-with-matching-circuit characteristic analyzing unit 132 includes an antenna-model-with-matching-circuit creating unit 132a, an antenna characteristic calculating unit 132b, and a calculation result determining unit 132c.

The antenna-model-with-matching-circuit creating unit 132a imports an antenna characteristic of an antenna model that does not include a matching circuit which is stored in the analysis result file 121. That is, the antenna-model-with-matching-circuit creating unit 132a imports radiation efficiency, antenna impedance, and an S parameter for each subject frequency. Depending on an embodiment, the antenna-model-with-matching-circuit creating unit 132a imports radiation efficiency, antenna impedance, and an S parameter, all of which are input by the input unit 110 for each subject frequency.

The antenna-model-with-matching-circuit creating unit 132a calculates a circuit configuration of a matching circuit according to the imported S parameter. Depending on an embodiment, the antenna-model-with-matching-circuit creating unit 132a obtains data of a circuit configuration of a matching circuit which is input by the input unit 110.

In accordance with a calculated or obtained circuit configuration, the antenna-model-with-matching-circuit creating unit 132a determines a matching element that forms a matching circuit and that conforms to a use condition such as a size or pressure resistance. Data of a use condition such as a size or a pressure resistance is provided in advance via, for example, an input by the input unit 110.

Depending on an embodiment, the antenna-model-with-matching-circuit creating unit 132a determines a matching element that forms a matching circuit by referring to data of a matching element stored in the matching element data file 123. Depending on an embodiment, according to data of a matching element input by the input unit 110, the antenna-model-with-matching-circuit creating unit 132a determines a matching element that conforms to a use condition.

In addition to capacitance or inductance of the determined matching element, the antenna-model-with-matching-circuit creating unit 132a obtains parasitic inductance or parasitic capacitance and loss resistance.

Depending on an embodiment, parasitic inductance or parasitic capacitance and loss resistance are obtained by referring to data of a corresponding matching element which is stored in the matching element data file 123. Depending on an embodiment, parasitic inductance or parasitic capacitance and loss resistance of a matching element are obtained via an input from the input unit 110.

In this way, in an embodiment, the antenna-model-with-matching-circuit creating unit 132a creates an antenna model provided with a matching element including capacitance or inductance of a matching element as well as parasitic reactance and loss reactance of the matching element. Values including parasitic reactance and loss resistance of a matching element that forms a created matching circuit are obtained from the matching element data file 123 or are designated via an input from the input unit 110.

Accordingly, in an embodiment, each model of parasitic reactance and loss resistance does not need to be individually created in addition to capacitance or inductance of each matching element that forms a matching circuit, and these values do not need to be individually set. As a result, it is possible to quickly and efficiently create an antenna model provided with a matching circuit and further including parasitic reactance and loss resistance of a matching element.

The antenna characteristic calculating unit 132b calculates an antenna characteristic of an antenna model provided with a matching circuit and created by the antenna-model-with-matching-circuit creating unit 132a. In an embodiment, without a simulation, the antenna characteristic calculating unit 132b calculates an antenna characteristic of an antenna model which is provided with a matching circuit and to which capacitance or inductance and parasitic reactance and loss resistance of a matching element are added.

Calculated antenna characteristics include: parameters, such as an S parameter, radiation efficiency, and total efficiency, which represent a matching state of an antenna model to which a matching circuit is added; and power consumption for each matching element that forms the matching circuit.

In the following, descriptions will be given of a method in accordance with an embodiment for calculating an antenna characteristic of an antenna model which is provided with a matching circuit and to which capacitance or inductance and parasitic reactance and loss resistance of a matching element have been added.

In order to explain the method, descriptions will first be given to parameters used to calculate an antenna characteristic in accordance with an embodiment.

Figure 2:
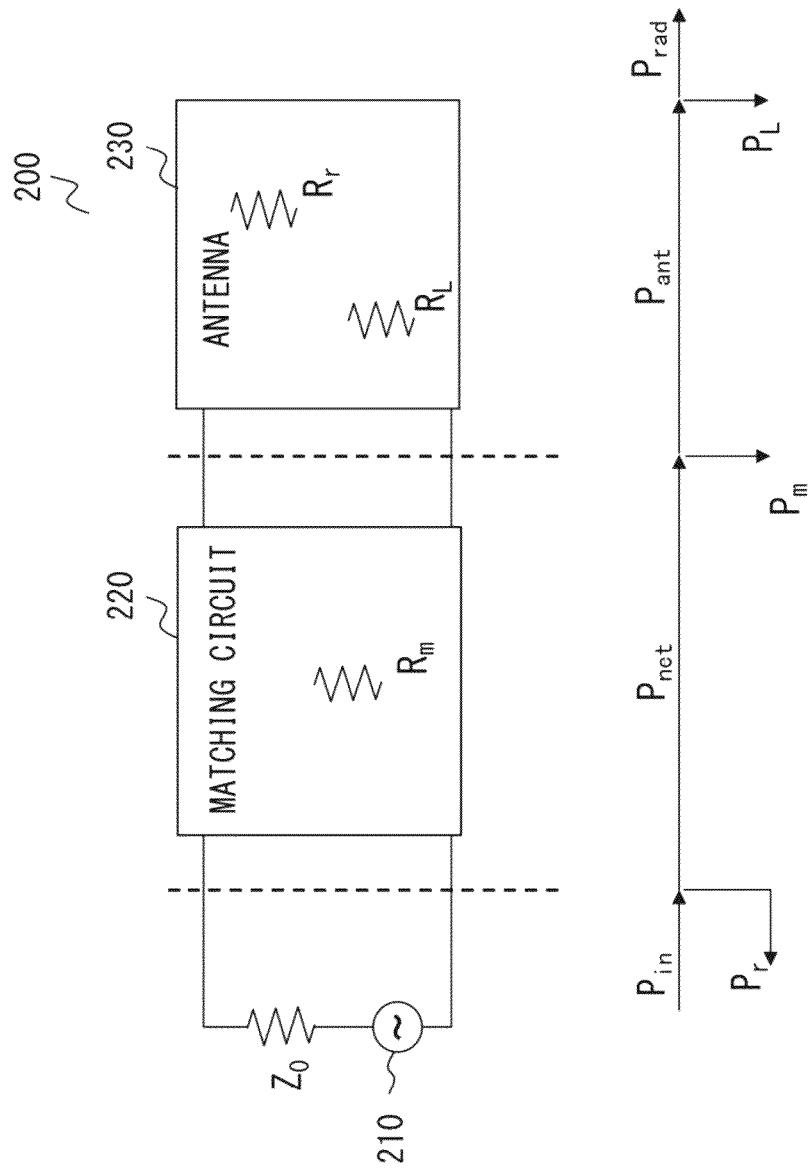
FIG. 2 is an explanatory diagram illustrating each parameter used to calculate an antenna characteristic in accordance with an embodiment.

FIG. 2 is an explanatory diagram illustrating each parameter used to calculate an antenna characteristic in accordance with an embodiment.

As illustrated in FIG. 2, an equivalent circuit 200 of an antenna model provided with a matching circuit in accordance with an embodiment includes a wave source 210, a matching circuit 220, and an antenna 230.

$Z_0$ in FIG. 2 indicates an internal impedance of the wave source 210. The internal impedance $Z_0$ of the wave source 210 is, for example, 50Ω.

$R_m$ in FIG. 2 indicates a loss resistance of a matching element that forms the matching circuit 220. When reactance of the matching element is $X_m$, impedance $Z_m$ of the matching element is expressed by the following formula, (2).

$$Z_m = R_m + jX_m \quad \text{[Formula 2]}$$

$R_r$ in FIG. 2 indicates a radiation resistance of the antenna 230. $R_L$ indicates a loss resistance of the antenna 230. When impedance of the antenna 230 alone, not including a matching circuit, is $Z_a$, the antenna impedance $Z_a$ is indicated as a function of the radiation resistance $R_r$ of the antenna and the loss resistance $R_L$ of the antenna and is expressed by the following formula, (3).

$$Z_a(R_r, R_L) = R_a + jX_a \quad \text{[Formula 3]}$$

In formula (3), $R_a$ is a real part of the antenna impedance $Z_a$ and $X_a$ is an imaginary part of the antenna impedance $Z_a$.

As described above, in an embodiment, the real part $R_a$ and the imaginary part $X_a$ of the antenna impedance $Z_a$ are known values. That is, depending on an embodiment, the real part $R_a$ and the imaginary part $X_a$ of the antenna impedance are determined in a simulation performed by the simulation analyzing unit 131b, and, depending on an embodiment, they are obtained via an input by the input unit 110.

$P_{in}$ in FIG. 2 indicates electric power sent from the wave source 210. $P_r$ indicates reflected power. $P_{net}$ indicates actual electric power input to the antenna 230 side at the position of the matching circuit 220 and is expressed by a relational expression, $P_{net} = P_{in} - P_r$.

$P_m$ indicates electric power that is lost by a loss included in the matching circuit 220. $P_{ant}$ is actual electric power input to the antenna 230 and is expressed by a relational expression, $P_{ant}=P_{net}-P_m$.

$P_L$ indicates electric power that is lost by losses included in the antenna 230 such as a dielectric loss and a conductor loss. $P_{rad}$ indicates radiated power and is expressed by a relational expression, $P_{rad}=P_{ant}-P_L$.

In an embodiment, radiation efficiency η indicates the ratio between electric power $P_{net}$ input to the antenna 230 side at the position at which the matching circuit 220 is inserted and radiated power $P_{rad}$ from the antenna 230, and radiation efficiency η is expressed by the following formula, (4).

$$\eta = P_{rad}/P_{net} \quad \text{[Formula 4]}$$

As described above, for an antenna model that does not include a matching circuit, a loss included in the matching circuit does not need to be considered, so radiation efficiency η is the ratio between actual electric power $P_{ant}$ input to the antenna and radiated power $P_{rad}$ from the antenna.

Total efficiency $\eta_t$ indicates the ratio between all of the input electric power $P_{in}$ and radiated power $P_{rad}$ from the antenna 230 and is expressed by the following formula, (5).

$$\eta = P_{rad}/P_{in} \quad \text{[Formula 5]}$$

On the premise of the descriptions of the parameters described with reference to FIG. 2, descriptions will be given of a method for calculating an antenna characteristic in accordance with an embodiment by taking as examples a case in which one matching element is inserted in series in an antenna model as the matching circuit 220, a case in which one matching element is inserted in parallel in an antenna model as the matching circuit 220, and a case in which three matching elements are inserted in an antenna model as the matching circuit 220 in a Π-shaped pattern.

Figure 3:
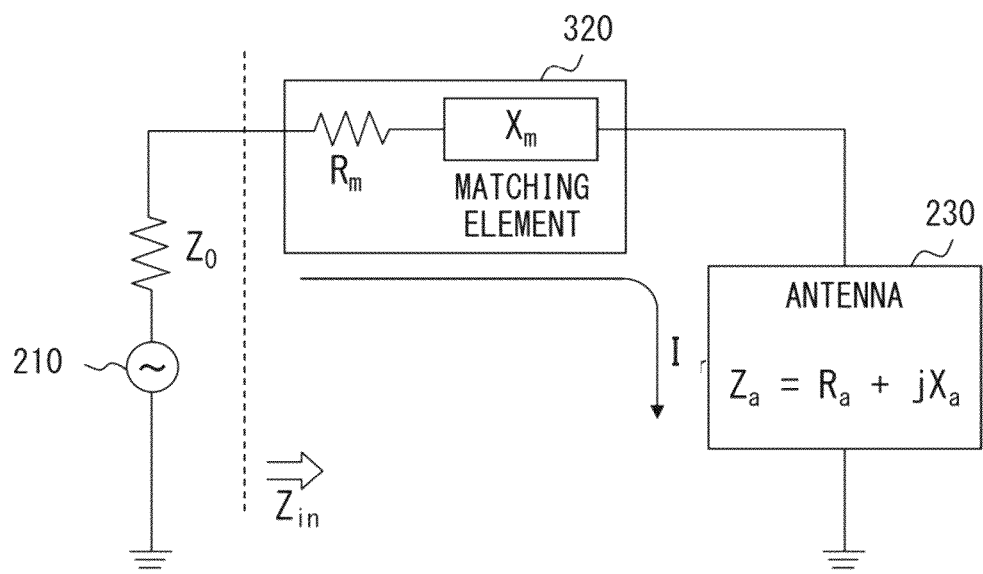
FIG. 3 is a circuit model diagram illustrating a case in which one matching element is inserted in series as a matching circuit.

FIG. 3 is a circuit model diagram illustrating a case in which one matching element is inserted in series as a matching circuit.

In FIG. 3, one matching element 320 is inserted in series as the matching circuit 220 in an equivalent circuit of an antenna model.

First, in accordance with an embodiment, descriptions will be given of calculation of an input-side reflection coefficient $S_{11}$ at the position at which the matching circuit 220 is inserted. The reflection coefficient $S_{11}$ may be expressed by the following formula, (6).

$$S_{11} = \frac{Z_{in} - Z_0}{Z_{in} + Z_0} \quad \text{[Formula 6]}$$

$Z_{in}$ in formula (6) is input impedance for the wave source 210, and, in the evaluation circuit model illustrated in FIG. 3, $Z_{in}$ is expressed by the following formula, (7).

$$Z_{in} = Z_a + Z_m \quad \text{[Formula 7]}$$

As described above, the real part $R_a$ and the imaginary part $X_a$ of the antenna impedance $Z_a$ are known values.

As described above, in addition to capacitance or inductance of a matching element that forms the matching circuit 220, the antenna-model-with-matching-circuit creating unit 132a obtains parasitic inductance or parasitic capacitance and loss resistance. Capacitance and parasitic inductance of a matching element or inductance and parasitic capacitance of the matching element correspond to reactance $X_m$ of the matching element. As a result, reactance $X_m$ and loss resistance $R_m$ of a matching element that forms the matching circuit 220 are also known values.

Accordingly, since $Z_a$ and $Z_m$ in formula (7) are known values, the antenna characteristic calculating unit 132b may calculate the reflection coefficient $S_{11}$ of the antenna model in FIG. 3 in accordance with formula (6).

Next, descriptions will be given of a calculation of radiation efficiency η in accordance with an embodiment.

Radiation efficiency $\eta_a$ of an antenna in an antenna model that does not include a matching circuit is expressed by the following formula, (8).

$$\eta_a = \frac{P_{rad}}{P_{net}} = \frac{P_{rad}}{P_{ant}} \quad \text{[Formula 8]}$$

As described above, radiation efficiency $\eta_a$ of an antenna that does not include a matching circuit is a known value. That is, depending on an embodiment, radiation efficiency $\eta_a$ of an antenna model that does not include a matching circuit is determined in a simulation by the simulation analyzing unit 131b, and, depending on an embodiment, radiation efficiency $\eta_a$ is input by the input unit 110.

$P_{ant}/P_{net}$ is expressed by the following formula, (9).

$$\frac{P_{ant}}{P_{net}} = \frac{R_a}{R_m + R_a} \quad \text{[Formula 9]}$$

On the premise of formulae (8) and (9), radiation efficiency η of an antenna in an antenna model provided with a matching element 320 may be expressed as the following formula, (10).

$$\eta = \frac{P_{rad}}{P_{net}} = \frac{P_{ant}}{P_{net}} \frac{P_{rad}}{P_{ant}} = \frac{R_a}{R_m + R_a} \eta_a \quad \text{[Formula 10]}$$

As described above, $\eta_a$, $R_a$, and $R_m$ in formula (10) are known values. Accordingly, in accordance with formula (10), the antenna characteristic calculating unit 132b may calculate radiation efficiency η of an antenna of an antenna model provided with the matching element 320.

In addition, descriptions will be given of calculation of total efficiency $\eta_t$ in accordance with an embodiment. Total efficiency $\eta_t$ of an antenna model provided with a matching circuit is expressed by the following formula, (11).

$$\eta_t = \eta(1-|S_{11}|^2) \quad \text{[Formula 11]}$$

Radiation efficiency η and reflection coefficient $S_{11}$ of the antenna in formula (11) are known values according to the aforementioned calculation. Accordingly, the antenna characteristic calculating unit 132b may calculate total efficiency $\eta_t$ of an antenna model provided with the matching element 320 in accordance with formula (11).

Figure 4:
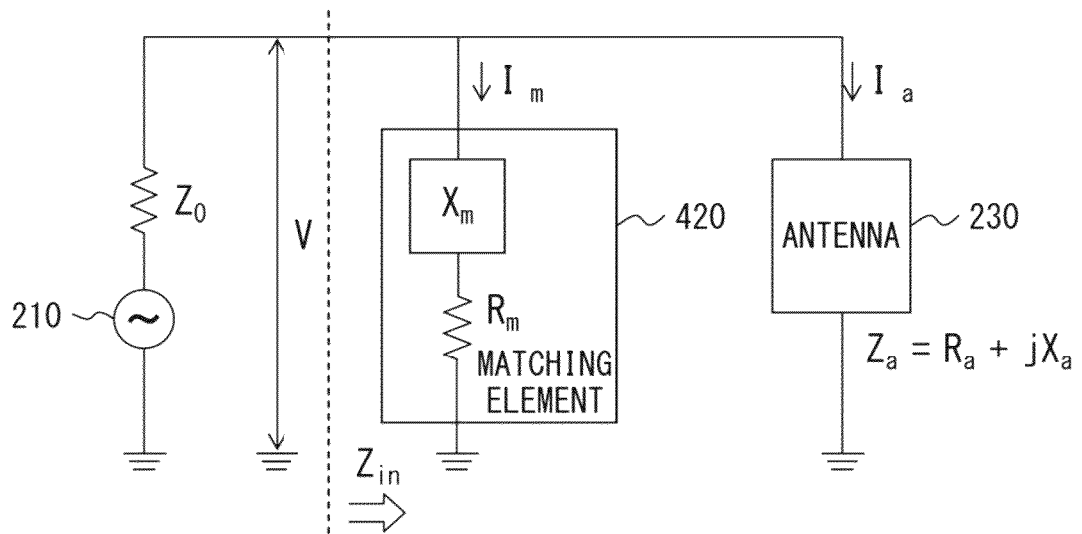
FIG. 4 is a circuit model diagram illustrating a case in which one matching element is inserted in parallel as a matching circuit.

FIG. 4 is a circuit model diagram illustrating a case in which one matching element is inserted in parallel as a matching circuit.

In FIG. 4, one matching element 420 is inserted in parallel as a matching circuit 220 in an equivalent circuit of an antenna model.

First, in accordance with an embodiment, descriptions will be given of a calculation of reflection coefficient $S_{11}$ on an input side at the position at which the matching circuit 220 is inserted.

Reflection coefficient $S_{11}$ may be calculated in accordance with the aforementioned formula, (6). However, in the equivalent circuit of the antenna model in FIG. 4, the input impedance $Z_{in}$ viewed from a wave source 210 and indicated in formula (6) is expressed by the following formula, (12).

$$Z_{in} = \frac{Z_m Z_a}{Z_m + Z_a} \quad \text{[Formula 12]}$$

As described above, all of $R_a$, $X_a$, $X_m$ and $R_m$ are known values, and hence $Z_{in}$ indicated in formula (12) may be obtained.

Accordingly, the antenna characteristic calculating unit 132b may calculate reflection coefficient $S_{11}$ of the antenna model in FIG. 4 in accordance with formula (6).

Next, descriptions will be given of a calculation of radiation coefficient η in accordance with an embodiment.

In the antenna model in FIG. 4, $P_{ant}/P_{net}$ is expressed by the following formula, (13).

$$\frac{P_{ant}}{P_{net}} = \frac{I_a^2 R_a}{I_m^2 R_m + I_a^2 R_a} \quad \text{[Formula 13]}$$
$$= \frac{\frac{V^2}{R_a^2 + X_a^2} R_a}{\frac{V^2}{R_m^2 + X_m^2} R_m + \frac{V^2}{R_a^2 + X_a^2} R_a}$$
$$= \frac{(R_m^2 + X_m^2) R_a}{(R_a^2 + X_a^2) R_m + (R_m^2 + X_m^2) R_a}$$

As illustrated in FIG. 4, $I_a$ in formula (13) is a current that flows through the antenna 230 and $I_m$ is a current that flows through the matching element 420. As illustrated in FIG. 4, V in formula (13) is a voltage across the antenna 230 and the matching element 420.

On the premise of formulae (8) and (13), radiation efficiency η of the antenna of the antenna model in FIG. 4 may be expressed by the following formula, (14).

$$\eta = \frac{P_{rad}}{P_{net}} = \frac{P_{ant}}{P_{net}} \frac{P_{rad}}{P_{ant}} = \frac{(R_m^2 + X_m^2) R_a}{(R_a^2 + X_a^2) R_m + (R_m^2 + X_m^2) R_a} \eta_a \quad \text{[Formula 14]}$$

As described above, $\eta_a$, $R_a$, $X_a$, $X_m$ and $R_m$ in formula (14) are known values. Accordingly, the antenna characteristic calculating unit 132b may calculate radiation efficiency η of the antenna of the antenna model in FIG. 4 in accordance with formula (14).

In addition, total efficiency $\eta_t$ is expressed by the aforementioned formula (11). As described above, radiation efficiency η and reflection coefficient $S_{11}$ of the antenna in formula (11) are known values. Accordingly, in accordance with formula (11), the antenna characteristic calculating unit 132b may calculate total efficiency $\eta_t$ of the antenna of the antenna model provided with the matching element 420.

As described above, in accordance with an embodiment, whether it is a case in which a matching element that forms the matching circuit 220 is inserted in series in an antenna model or a case in which the matching element is inserted in parallel, an antenna characteristic of an antenna model provided with a matching circuit and including capacitance or inductance and parasitic reactance and loss resistance of a matching element may be calculated without performing a simulation.

With reference to FIG. 3 and FIG. 4, descriptions have been given of a case in which one matching element is inserted as the matching circuit 220 in an equivalent circuit of an antenna model. However, it is also possible to perform calculation for a case in which a plurality of matching elements are inserted as the matching circuit 220 in an equivalent circuit of an antenna model, as with a case in which one matching element is inserted. In the following, as an example of such a case, descriptions will be given of a case in which, as the matching circuit 220, three matching elements are inserted in a n-shaped pattern in an equivalent circuit of an antenna model.

Figure 5:
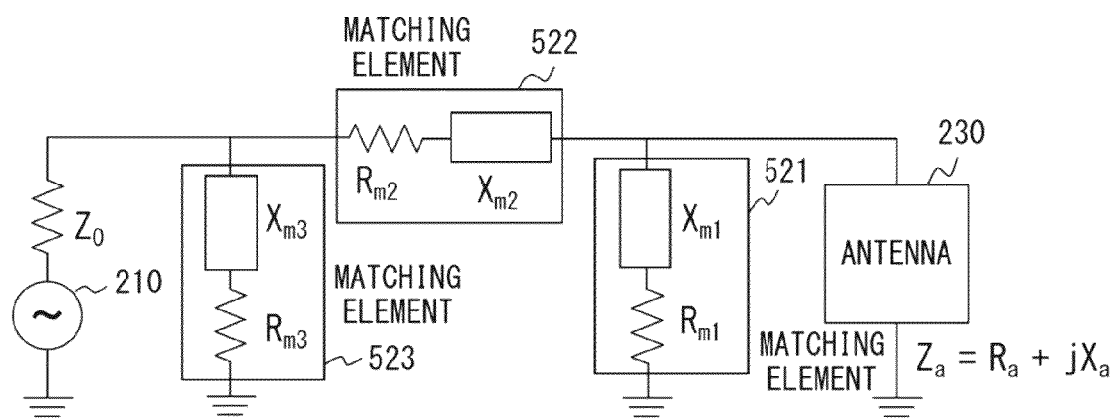
FIG. 5 is a circuit model diagram illustrating a case in which three matching elements are inserted in a π-shaped pattern as a matching circuit.

FIG. 5 is a circuit model diagram illustrating a case in which three matching elements are inserted in a n-shaped pattern as a matching circuit.

In FIG. 5, as the matching circuit 220, three matching elements 521 to 523 are inserted in a n-shaped pattern in an equivalent circuit of an antenna model.

$X_{m1}$ in FIG. 5 is a reactance of the matching element 521. $R_{m1}$ is a loss resistance of the matching element 521. $X_{m2}$ is a reactance of the matching element 522. $R_{m2}$ is a loss resistance of the matching element 522. $X_{m3}$ is a reactance of the matching element 523. $R_{m3}$ is a loss resistance of the matching element 523.

First, in accordance with an embodiment, descriptions will be given of a calculation of reflection coefficient $S_{11}$ on an input side at the position at which the matching circuit 220 is inserted.

Reflection coefficient $S_{11}$ may be represented by the aforementioned formula, (6). $Z_{in}$ in formula (6) in the circuit model in FIG. 5 may be obtained using a calculation method similar to formulae (7) and (12) for the case described using FIG. 3 and FIG. 4 in which one matching element is inserted as a matching circuit.

That is, when impedance of the matching element 521 is $Z_{m1}$, impedance of the matching element 522 is $Z_{m2}$, and impedance of the matching element 523 is $Z_{m3}$, $Z_{m1}$, $Z_{m2}$ and $Z_{m3}$ may be respectively represented as $Z_{m1}=R_{m1}+jX_{m1}$, $Z_{m2}=R_{m2}+jX_{m2}$, and $Z_{m3}=R_{m3}+X_{m4}$. FIG. 6 is an equivalent circuit diagram representing the equivalent circuit illustrated in FIG. 5 by using $Z_{m1}$, $Z_{m2}$ and $Z_{m3}$.

In FIG. 6, a sum $Z_{am1}$ of $Z_a$ and $Z_{m1}$ is expressed by the following formula, (15), as with formula (12) for the aforementioned case in which one matching element 420 is inserted in parallel.

$$Z_{am1} = \frac{Z_{m1} Z_a}{Z_{m1} + Z_a} \quad \text{[Formula 15]}$$

Figure 7:
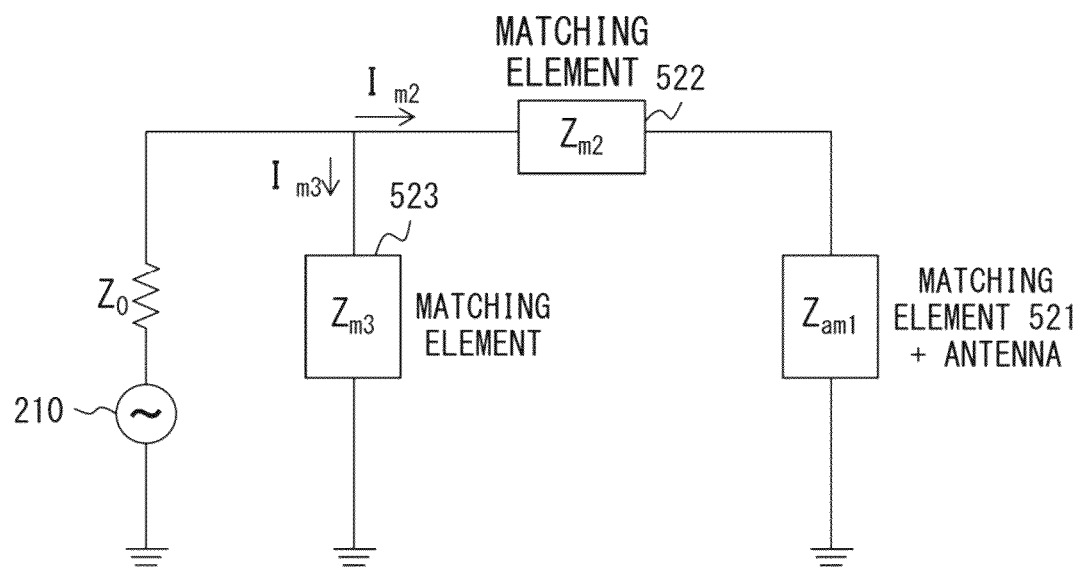
FIG. 7 is an equivalent circuit diagram representing the equivalent circuit illustrated in FIG. 6 using $Z_{am1}$.

FIG. 7 is an equivalent circuit diagram representing the equivalent circuit illustrated in FIG. 6 by using $Z_{am1}$.

In FIG. 7, a sum $Z_{am2}$ of $Z_{am1}$ and $Z_{m2}$ is expressed by the following formula, (16), as with formula (7) for the aforementioned case in which one matching element 320 is inserted in series.

$$Z_{am2} = \frac{Z_{m1} Z_a}{Z_{m1} + Z_a} + Z_{m2} \quad \text{[Formula 16]}$$

Figure 8:
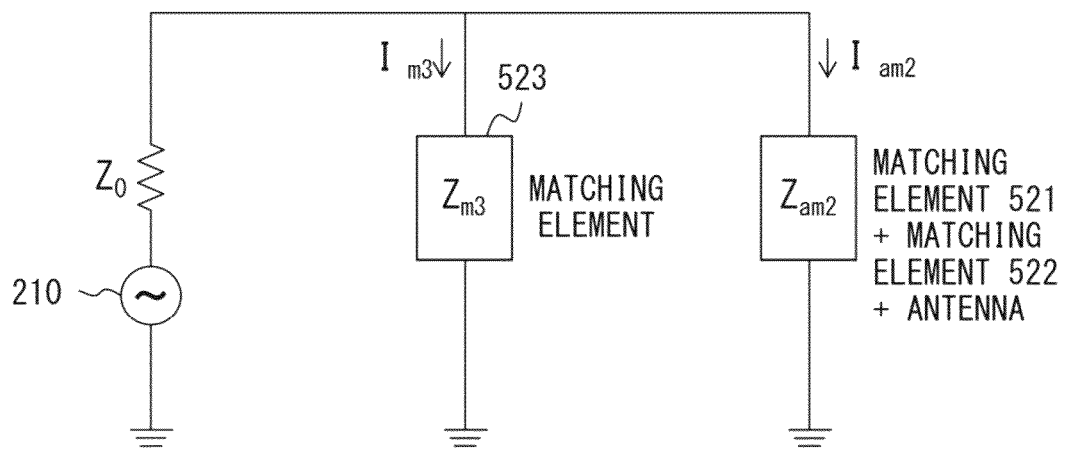
FIG. 8 is an equivalent circuit diagram representing the equivalent circuit illustrated in FIG. 7 using $Z_{am2}$.

FIG. 8 is an equivalent circuit diagram representing the equivalent circuit illustrated in FIG. 7 by using $Z_{am2}$.

In FIG. 8, a sum $Z_{am3}$ of $Z_{am2}$ and $Z_{m3}$, i.e., $Z_{in}$ in formula (6), is expressed by the following formula, (17), as with formula (12) for the aforementioned case in which one matching element 420 is inserted in parallel.

$$Z_{am3} = \frac{Z_{am2} Z_{m3}}{Z_{m3} + Z_{am2}} \quad \text{[Formula 17]}$$

$Z_{am2}$ and $Z_{m3}$ in formula (17) are configured by known values obtained by the antenna-model-with-matching-circuit creating unit 132a. Accordingly, the antenna characteristic calculating unit 132b may calculate reflection coefficient $S_{11}$ of the antenna model in FIG. 5 in accordance with formula (6).

Next, descriptions will be given of calculation of radiation efficiency η in accordance with an embodiment.

Radiation efficiency η of the antenna model in FIG. 5 may be expressed by the following formula, (18).

$$\eta = \frac{|i_r|^2 R_r}{|i_{m3}|^2 R_{m3} + |i_{m2}|^2 R_{m2} + |i_{m1}|^2 R_{m1} + |i_a|^2 R_a} \quad \text{[Formula 18]}$$

$$= \frac{|i_a|^2 R_a}{|i_{m3}|^2 R_{m3} + |i_{m2}|^2 R_{m2} + |i_{m1}|^2 R_{m1} + |i_a|^2 R_a}$$

$$\frac{|i_r|^2 R_r}{|i_a|^2 R_a}$$

$$= \frac{|i_a|^2 R_a}{|i_{m3}|^2 R_{m3} + |i_{m2}|^2 R_{m2} + |i_{m1}|^2 R_{m1} + |i_a|^2 R_a} \eta_a$$

$i_r$ in formula (18) is a current that flows through a radiation resistance $R_r$. $i_a$ is a current that flows through the antenna 230 as illustrated in FIG. 6, $i_{m1}$ is a current that flows through the matching element 521, $i_{m2}$ is a current that flows through the matching element 522, and $i_{m3}$ is a current that flows through the matching element 523.

As indicated by formula (18), radiation efficiency η may be represented using antenna radiation efficiency $\eta_a$ of an antenna model that does not include a matching element, and since radiation efficiency $\eta_a$ is a known value, a current $i_r$ does not need to be determined. Currents $i_{m1}$ and $i_{m2}$ in formula (18) may be represented as follows.

First, in FIG. 8, a current $i_{sm2}$ that flows through the sum of the matching element 521, the matching element 522, and the antenna 203 is expressed by the following formula, (19).

$$i_{am2} = \frac{Z_{m3}}{Z_{am2}} i_{m3} \quad \text{[Formula 19]}$$

As is clear from FIG. 7, $i_{am2}$ is equal to the current $i_{m2}$ that flows through the matching element 522. Accordingly, the current $i_{m2}$ that flows through the matching element 522 is expressed by the following formula, (20).

$$i_{m2} = \frac{Z_{m3}}{Z_{am2}} i_{m3} \quad \text{[Formula 20]}$$

In FIG. 6, the current $i_{m1}$ that flows through the matching element 521 and the current $i_a$ that flows through the antenna 203 are expressed by the following formulae, (21) and (22), respectively.

$$i_{m1} = \frac{Z_a}{Z_{m1} + Z_a} i_{m2} = \frac{Z_a}{Z_{m1} + Z_a} \frac{Z_{am3}}{Z_{am2}} i_{m3} \quad \text{[Formula 21]}$$

$$i_a = \frac{Z_{m1}}{Z_{m1} + Z_a} i_{m2} = \frac{Z_{m1}}{Z_{m1} + Z_a} \frac{Z_{am3}}{Z_{am2}} i_{m3} \quad \text{[Formula 22]}$$

Substituting formulae (20) to (22) above into formula (18) may erase $i_{m3}$ in both the denominator and the numerator of formula (18). The values in formula (18) after the erasing are known values so that the antenna characteristic calculating unit 132b may calculate radiation efficiency η of the antenna model illustrated in FIG. 5 in accordance with formula (18).

In regard to the total efficiency $\eta_t$ of the antenna model illustrated in FIG. 5, the antenna characteristic calculating unit 132b may calculate this total efficiency $\eta_t$ from a known value in accordance with formula (11).

In this way, in accordance with the aforementioned calculation method, the antenna characteristic calculating unit 132b calculates an antenna characteristic of an antenna model provided with a matching circuit and including capacitance or inductance of a matching circuit as well as parasitic inductance and loss resistance. That is, in an embodiment, using an antenna characteristic of an antenna model that does not include a matching circuit, an antenna characteristic of an antenna model provided with a matching circuit and further including parasitic reactance and loss resistance of a matching element is calculated without performing a simulation.

Accordingly, it is possible to obtain in a short time an antenna characteristic of an antenna model provided with a matching circuit and further including parasitic reactance and loss resistance of a matching element, thereby enabling a desired antenna to be designed efficiently.

The antenna characteristic calculating unit 132b calculates power consumption for each matching element by using, for example, a voltage value of the wave source 110 and a value of impedance of a matching element, both of which are known values.

Using the total efficiency calculated by the antenna characteristic calculating unit 132b, the calculation result determining unit 132c determines whether or not an antenna model provided with a matching circuit satisfies a desired standard.

In the following, descriptions will be given of the reason why total efficiency is used for the determination by the calculation result determining unit 132c. For such descriptions, taking as examples a case in which one matching element is inserted in series as the matching circuit 220 and a case in which one matching element is inserted in parallel as the matching circuit 220, descriptions will be given of a relationship of loss resistance $R_m$ included in a matching element that forms the matching circuit 220 with antenna characteristics, i.e., reflection coefficient $S_{11}$, radiation efficiency η, and total radiation efficiency $\eta_t$.

First, descriptions will be given of the case illustrated in FIG. 3 in which one matching element 320 is inserted in series as the matching circuit 220. For clarification, assume that the antenna 230 includes no loss ($R_L$=0).

In the model diagram illustrated in FIG. 3, a relationship between reflection coefficient $S_{11}$ and loss resistance $R_m$ of a matching element 320 may be described as follows.

When $|S_{11}|^2$ is calculated to describe a relationship between loss resistance $R_m$ included in the matching element 320 and the absolute value $|S_{11}|$ of the reflection coefficient $S_{11}$, $|S_{11}|^2$ is expressed by the following formula, (23), by using the aforementioned formulae (2), (3) and (6).

$$|S_{11}|^2 = \frac{R_m^2 + 2(R_r - Z_0)R_m + (R_r - Z_0)^2 + (X_a + X_m)^2}{R_m^2 + 2(R_r + Z_0)R_m + (R_r + Z_0)^2 + (X_a + X_m)^2} \quad \text{[Formula 23]}$$

$$\equiv \frac{R_m^2 + bR_m + c}{R_m^2 + \beta R_m + \gamma}$$

Note that b, c, β, and γ in formula 23 are as indicated by the following formulae, (24) to (27).

$$b = 2(R_r - Z_0)$$ [Formula 24]

$$c = (R_r - Z_0)^2 + (X_a + X_m)^2$$ [Formula 25]

$$\beta = 2(R_r + Z_0)$$ [Formula 26]

$$\gamma = (R_r + Z_0)^2 + (X_a + X_m)^2$$ [Formula 27]

When $|S_{11}|^2$ is differentiated with respect to $R_m$ to describe a relationship between the loss resistance $R_m$ and the absolute value of the reflection coefficient $S_{11}$, $|S_{11}|$, the following formula, (28), is expressed.

$$\frac{\partial |S_{11}|^2}{\partial R_m} = \frac{(2R_m + b)(R_m^2 + \beta R_m + \gamma) - (2R_m + \beta)(R_m^2 + bR_m + c)}{(R_m^2 + \beta R_m + \gamma)^2}$$

$$= 4Z_0 \frac{R_m^2 + 2R_r R_m + [R_r^2 - Z_0^2 - (X_a + X_m)^2]}{(R_m^2 + \beta R_m + \gamma)^2}$$

$$= 4Z_0 \frac{F(R_m)}{(R_m^2 + \beta R_m + \gamma)^2}$$ [Formula 28]

Note that $F(R_m)$ in formula (28) is as indicated by the following formula, (29).

$$F(R_m) R_m^2 + 2R_r R_m + [R_r^2 - Z_0^2 - (X_a + X_m)^2]$$ [Formula 29]

The denominator of formula (28) is always a positive value, so the relationship between $F(R_m)$ and $R_m$ is investigated.

$F(R_m)$ is a quadratic equation with respect to $R_m$. The coefficient of $R_m^2$ is a positive value and $F(R_m)$ thus shows a downward-pointing convex parabola. Depending on whether the third term of $F(R_m)$, $[R_a^2 - Z_0^2 - (X_a + X_m)^2]$, becomes a positive value or whether it becomes a negative value, a characteristic of $F(R_m)$ changes.

When $R_a^2 - Z_0^2 - (X_a + X_m)^2 > 0$, $F(R_m)$ always becomes a positive value. Accordingly, as $R_m$ becomes larger, $|S_{11}|$ becomes larger, i.e., becomes worse.

Figure 9:
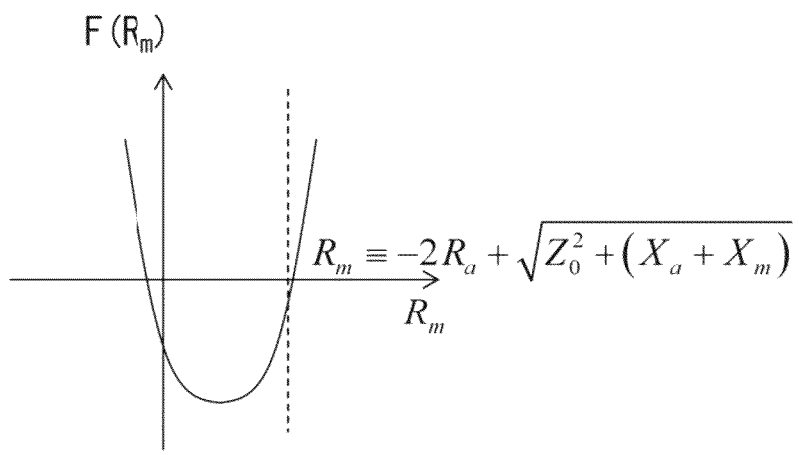
FIG. 9 is a diagram illustrating a relationship between $R_m$ and $F(R_m)$ under the condition that $R_a^2 - Z_0^2 - (X_a + X_m)^2 < 0$.
Figure 10:
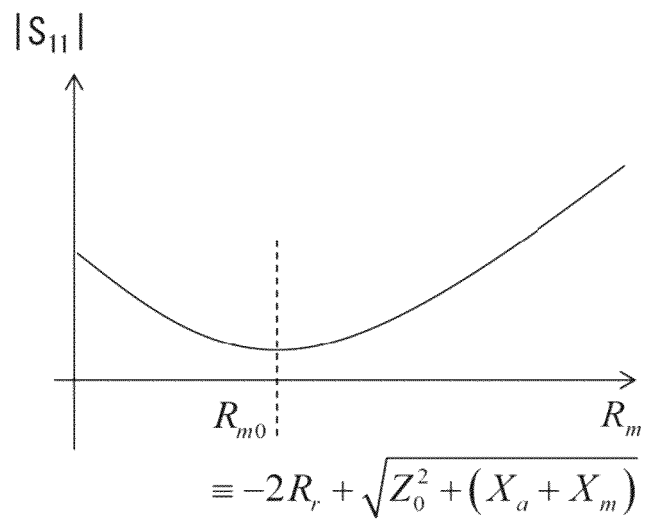
FIG. 10 is a diagram illustrating a relationship between $R_m$ and $|S_{11}|$ under the condition that $R_a^2 - Z_0^2 - (X_a + X_m)^2 < 0$.

Meanwhile, when $R_a^2 - Z_0^2 - (X_a + X_m)^2 < 0$, $F(0)$ always becomes a negative value as illustrated in FIG. 9. As $R_m$ increases from 0, $F(R_m)$ changes from a negative value to a positive value. As illustrated in FIG. 10, as $R_m$ increases from 0, $|S_{11}|$ becomes smaller and then becomes larger. That is, $|S_{11}|$ becomes better and then becomes worse.

Assuming that $X_a + X_m$ is approximated to 0 to more clearly describe the relationship between $R_m$ and $|S_{11}|$, when $R_a^2 - Z_0^2 > 0$, i.e., when $R_a > Z_0$, as $R_m$ becomes larger, $|S_{11}|$ becomes larger, i.e., becomes worse. When $R_a^2 - Z_0^2 < 0$, i.e., when $R_a < Z_0$, as $R_m$ becomes larger, $|S_{11}|$ becomes better and then becomes worse.

Accordingly, in the case illustrated in FIG. 3 in which one matching element 320 is inserted in series as the matching circuit 220, as loss resistance $R_m$ of the matching element 320 becomes larger, matching becomes better in some situations and becomes worse in other situations.

Next, in the model diagram illustrated in FIG. 3, a relationship between radiation efficiency η and loss resistance $R_m$ of a matching element 320 may be described as follows.

A radiation efficiency η that does not depend on $R_{rad}/P_{net}$ matching is expressed by the following formula, (30).

$$\eta = \frac{I_r^2 R_r}{I_r^2 R_m + I_r^2 R_r}$$ [Formula 30]

$$= \frac{R_r}{R_m + R_r}$$

As illustrated in FIG. 3, $I_r$ in formula (30) indicates a current that flows through the matching element 320 and the antenna 230.

Formula (30) clarifies that, as loss resistance $R_m$ of the matching element 320 increases, radiation efficiency η becomes smaller, i.e., becomes worse.

In addition, in the model diagram in FIG. 3, a relationship between total efficiency $\eta_t$ and loss resistance $R_m$ of the matching element 320 may be described as follows.

When $1 - |S_{11}|^2$ is calculated to calculate total efficiency $\eta_t$, $1 - |S_{11}|^2$ may be expressed as indicated by the following formula, (31).

$$1 - |S_{11}|^2 = \frac{4(R_m + R_r)Z_0}{(R_m + R_r + Z_0)^2 + (X_a + X_m)^2}$$ [Formula 31]

In accordance with formulae (30) and (31), total efficiency $\eta_t$ may be expressed as indicated by the following formula, (32).

$$\eta_t = \eta(1 - |S_{11}|^2)$$ [Formula 32]

$$= \frac{R_r}{R_m + R_r} 4Z_0 \frac{R_m + R_r}{R_m^2 + 2(R_r + Z_0)R_m + (R_r + Z_0)^2 + (X_a + X_m)^2}$$

$$= \frac{4Z_0 R_r}{R_m^2 + 2(R_r + Z_0)R_m + (R_r + Z_0)^2 + (X_a + X_m)^2}$$

In formula (32), loss resistance $R_m$ of the matching element 320 is included in only the denominator. Accordingly, referring to formula (32), as loss resistance $R_m$ of the matching element 320 increases, total efficiency $\eta_t$ becomes smaller, i.e., becomes worse.

As described above, in the case illustrated in FIG. 3 in which one matching element 320 is inserted in series as the matching circuit 220, as loss resistance $R_m$ of the matching element 320 increases, matching becomes worse in some situations and becomes better in other situations. Meanwhile, increasing loss resistance $R_m$ of the matching element 320 worsens radiation efficiency η and total efficiency $\eta_t$ even when matching becomes better.

Next, descriptions will be given of the case illustrated in FIG. 4 in which one matching element 420 is inserted in parallel as the matching circuit 220. For clarification, assume that the antenna 230 includes no loss ($R_L = 0$).

In the model diagram illustrated in FIG. 4, a relationship between reflection coefficient $S_{11}$ and loss resistance $R_m$ of a matching element 420 may be described as follows.

Reflection coefficient $S_{11}$ in the case of one matching element 420 being provided in parallel may be expressed by the following formula, (33).

$$S_{11} = \frac{1 - Z_0 Y_{in}}{1 + Z_0 Y_{in}} \quad \text{[Formula 33]}$$

$Y_{in}$ in formula 33 is as indicated by the following formulae, (34) to (36).

$$Y_{in} = \frac{1}{Z_{in}} = Y_r - jY_i \quad \text{[Formula 34]}$$

$$Y_r = \frac{R_r}{R_r^2 + X_a^2} + \frac{R_m}{R_m^2 + X_m^2} = \frac{R_r}{|Z_a|^2} + \frac{R_m}{|Z_m|^2} \quad \text{[Formula 35]}$$

$$Y_i = \frac{X_a}{R_r^2 + X_a^2} + \frac{X_m}{R_m^2 + X_m^2} = \frac{X_a}{|Z_a|^2} + \frac{X_m}{|Z_m|^2} \quad \text{[Formula 36]}$$

$Y_r$ is a real part of an input admittance of the sum of the antenna 230 and the matching element 420. $Y_i$ is an imaginary part of the input admittance of the sum of the antenna 230 and the matching element 420.

When $|S_{11}|^2$ is calculated to describe a relationship between loss resistance $R_m$ included in the matching element 420 and the absolute value $|S_{11}|$ of the reflection coefficient $S_{11}$, $|S_{11}|^2$ is expressed by the following formula, (37).

$$|S_{11}|^2 = \frac{(1 - Z_0 Y_r)^2 + Z_0^2 Y_i^2}{(1 + Z_0 Y_r)^2 + Z_0^2 Y_i^2} \quad \text{[Formula 37]}$$

$$= \frac{1 - 2Z_0\left(\frac{R_r}{|Z_a|^2} + \frac{R_m}{|Z_m|^2}\right) + Z_0^2\left(\frac{1}{|Z_a|^2} + \frac{1}{|Z_m|^2} + 2\frac{R_r R_m + X_a X_m}{|Z_a|^2 |Z_m|^2}\right)}{1 + 2Z_0\left(\frac{R_r}{|Z_a|^2} + \frac{R_m}{|Z_m|^2}\right) + Z_0^2\left(\frac{1}{|Z_a|^2} + \frac{1}{|Z_m|^2} + 2\frac{R_r R_m + X_a X_m}{|Z_a|^2 |Z_m|^2}\right)}$$

$$= \frac{|Z_a|^2 |Z_m|^2 - 2Z_0 |Z_m|^2 R_r - 2Z_0 |Z_a|^2 R_m + Z_0^2 |Z_m|^2 + Z_0^2 |Z_a|^2 + 2Z_0^2 R_r R_m + 2Z_0^2 X_a X_m}{|Z_a|^2 |Z_m|^2 + 2Z_0 |Z_m|^2 R_r + 2Z_0 |Z_a|^2 R_m + Z_0^2 |Z_m|^2 + Z_0^2 |Z_a|^2 + 2Z_0^2 R_r R_m + 2Z_0^2 X_a X_m}$$

$$= \frac{(|Z_a|^2 - 2Z_0 R_r + Z_0^2)R_m^2 + 2(Z_0^2 R_r - Z_0 |Z_a|^2)R_m + |Z_a|^2 X_m^2 - 2Z_0 R_r X_m^2 + Z_0^2 X_m^2 + Z_0^2 |Z_a|^2 + 2Z_0^2 X_a X_m}{(|Z_a|^2 + 2Z_0 R_r + Z_0^2)R_m^2 + 2(Z_0^2 R_r + Z_0 |Z_a|^2)R_m + |Z_a|^2 X_m^2 + 2Z_0 R_r X_m^2 + Z_0^2 X_m^2 + Z_0^2 |Z_a|^2 + 2Z_0^2 X_a X_m}$$

$$= \frac{aR_m^2 + bR_m + c}{\alpha R_m^2 + \beta R_m + \gamma}$$

Note that a, b, c, α, β, and γ in formula (37) are as indicated by the following formulae, (38) to (43).

$$a = |Z_a|^2 - 2Z_0 R_r + Z_0^2 \quad \text{[Formula 38]}$$

$$b = 2(Z_0^2 R_r - Z_0 |Z_a|^2) \quad \text{[Formula 39]}$$

$$c = |Z_a|^2 X_m^2 - 2Z_0 R_r X_m^2 + Z_0^2 X_m^2 + Z_0^2 |Z_a|^2 + 2Z_0^2 X_a X_m \quad \text{[Formula 40]}$$

$$\alpha = |Z_a|^2 + 2Z_0 R_r + Z_0^2 \quad \text{[Formula 41]}$$

$$\beta = 2(Z_0^2 R_r + Z_0 |Z_a|^2) \quad \text{[Formula 42]}$$

$$\gamma = |Z_a|^2 X_m^2 + 2Z_0 R_r X_m^2 + Z_0^2 X_m^2 + Z_0^2 |Z_a|^2 + 2Z_0^2 X_a X_m \quad \text{[Formula 43]}$$

When $|S_{11}|^2$ is differentiated with respect to $R_m$ to describe a relationship between $R_m$ and $|S_{11}|$, the following formula, (44), is expressed.

$$\frac{\partial |S_{11}|^2}{\partial R_m} = \frac{(2aR_m + b)(\alpha R_m^2 + \beta R_m + \gamma) - (2\alpha R_m + \beta)(aR_m^2 + bR_m + c)}{(\alpha R_m^2 + \beta R_m + \gamma)^2} \quad \text{[Formula 44]}$$

$$= \frac{2a\alpha R_m^3 + b\alpha R_m^2 + 2a\beta R_m^2 + b\beta R_m + 2a\gamma R_m + b\gamma - 2a\alpha R_m^3 - a\beta R_m^2 - 2b\alpha R_m^2 - \beta b R_m - 2c\alpha R_m - c\beta}{(\alpha R_m^2 + \beta R_m + \gamma)^2}$$

$$= \frac{(a\beta - b\alpha)R_m^2 + 2(a\gamma - c\alpha)R_m + b\gamma - c\beta}{(\alpha R_m^2 + \beta R_m + \gamma)^2}$$

The denominator of formula (44) is always a positive value, so the relationship between the numerator and $R_m$ is investigated. The numerator of formula (44) is a quadratic equation with respect to $R_m$.

Formula (44) indicates that reflection coefficient $S_{11}$ behaves variously in accordance with an interrelationship between the coefficients in formula (37), a, b, c, α, β, and γ. Accordingly, relationships are illustrated in FIG. 11 between loss resistance $R_m$ and reflection coefficient $S_{11}$ in accordance with an interrelationship between the coefficients a, b, c, α, β, and γ.

FIG. 11 illustrates a relationship between loss resistance $R_m$ and reflection coefficient $S_{11}$ in a case in which one matching element is inserted in parallel as a matching circuit.

As illustrated in FIG. 11, as loss resistance $R_m$ becomes larger, reflection coefficient $S_{11}$ becomes better in some cases and becomes worse in other cases.

Accordingly, in a case in which one matching element 420 is inserted in parallel as the matching circuit 220, as loss resistance $R_m$ becomes larger, matching becomes worse in some situations and becomes better in other situations.

Next, in the model diagram illustrated in FIG. 4, a relationship between radiation efficiency η and loss resistance $R_m$ of a matching element 420 may be described as follows.

Radiation efficiency η that does not depend on $R_{rad}/P_{net}$ matching is expressed by the following formula, (45).

$$\eta = \frac{I_a^2 R_r}{I_m^2 R_m + I_a^2 R_r} \quad \text{[Formula 45]}$$

$$= \frac{\frac{V^2}{R_r^2 + X_a^2} R_r}{\frac{V^2}{R_m^2 + X_m^2} R_m + \frac{V^2}{R_r^2 + X_a^2} R_r}$$

$$= \frac{(R_m^2 + X_m^2) R_r}{(R_r^2 + X_a^2) R_m + (R_m^2 + X_m^2) R_r}$$

When η represented by formula (45) is differentiated with respect to $R_m$ to describe a relationship between radiation efficiency η and loss resistance $R_m$ of the matching element 420, the following formula, (46), is expressed.

$$\frac{\partial \eta}{\partial R_m} = \frac{2R_m R_r\{(R_r^2 + X_a^2)R_m + (R_m^2 + X_m^2)R_r\} -}{\{2R_m R_r + (R_r^2 + X_a^2)\}(R_m^2 + X_m^2)R_r} \quad \text{[Formula 46]}$$

$$= \frac{R_m^2 R_r(R_r^2 + X_a^2) - R_r X_m^2(R_r^2 + X_a^2)}{\{(R_r^2 + X_a^2)R_m + (R_m^2 + X_m^2)R_r\}^2}$$

$$= \frac{(R_m^2 - X_m^2)(R_r^2 + X_a^2)R_r}{\{(R_r^2 + X_a^2)R_m + (R_m^2 + X_m^2)R_r\}^2}$$

The portions of formula (46) that do not include ($R_m^2 - X_m^2$) in the numerator are always positive values. Accordingly, when $R_m$ is greater than $|X_m|$, formula (46) becomes a positive number, and when $R_m$ is less than $|X_m|$, formula (46) becomes a negative number.

Figure 12:
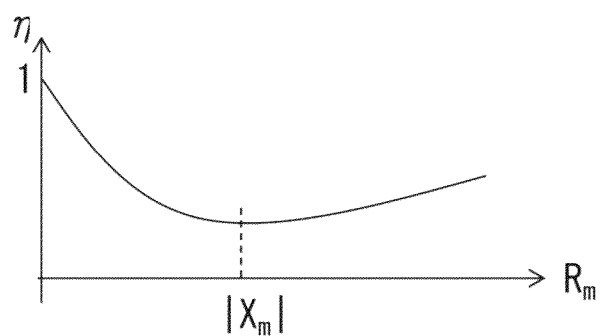
FIG. 12 illustrates a relationship between loss resistance $R_m$ and radiation coefficient $\eta$ in a case in which one matching element is inserted in parallel as a matching circuit.

That is, as illustrated in FIG. 12, in a case in which one matching element 420 is inserted in parallel as the matching circuit 220, as loss resistance $R_m$ of the matching element becomes larger, radiation efficiency η becomes smaller, and, as loss resistance $R_m$ becomes larger than the absolute value $|X_m|$ of reactance of the matching element 420, radiation efficiency η becomes larger.

However, in many situations, loss resistance $R_m$ of a matching element actually selected as a matching element that forms the matching circuit 220 becomes less than the absolute value $|X_m|$ of reactance of the matching element.

Accordingly, in the case in which one matching element 420 is inserted in parallel as the matching circuit 220, as loss resistance $R_m$ of the matching element 420 becomes larger, radiation efficiency η becomes worse.

In addition, in the model diagram illustrated in FIG. 4, a relationship between total efficiency $\eta_t$ and loss resistance $R_m$ of the matching element 420 may be described as follows.

When $1-|S_{11}|^2$ is calculated to calculate total efficiency $\eta_t$, $1-|S_{11}|^2$ may be expressed by the following formula, (47), using the aforementioned formula (37).

$$1 - |S_{11}|^2 = 1 - \frac{(1 - Z_0 Y_r)^2 + Z_0^2 Y_i^2}{(1 + Z_0 Y_r)^2 + Z_0^2 Y_i^2} \quad \text{[Formula 47]}$$

$$= \frac{4 Z_0 Y_r}{(1 + Z_0 Y_r)^2 + Z_0^2 Y_i^2}$$

In accordance with formulae (45) and (47), total efficiency $\eta_t$ may be expressed by the following formula, (48).

$$\eta_t = \eta(1 - |S_{11}|^2) \quad \text{[Formula 48]}$$

$$= \frac{(R_m^2 + X_m^2)R_r}{(R_r^2 + X_a^2)R_m + (R_m^2 + X_m^2)R_r} \cdot \frac{4 Z_0 Y_r}{1 + 2 Z_0 Y_r + Z_0^2 Y_r^2 + Z_0^2 Y_i^2}$$

$$= \frac{R_r}{|Z_a|^2} \cdot \frac{4 Z_0}{\left(1 + Z_0\left(\frac{R_r}{|Z_a|^2} + \frac{R_m}{R_m^2 + X_m^2}\right)\right)^2 + Z_0^2\left(\frac{X_a}{|Z_a|^2} + \frac{X_m}{R_m^2 + X_m^2}\right)^2}$$

When $\eta_t$ is differentiated with respect to $R_m$ to describe a relationship between total efficiency $\eta_t$ and loss resistance $R_m$ of the matching element 420, the following formula, (49), is expressed.

$$\frac{\partial \eta_t}{\partial R_m} = \frac{4 Z_0 R_r}{|Z_a|^2} \cdot \frac{2\left(1 + Z_0\left(\frac{R_r}{|Z_a|^2} + \frac{R_m}{R_m^2 + X_m^2}\right)\right) Z_0 \frac{X_m^2 - R_m^2}{(R_m^2 + X_m^2)^2} - 4 Z_0^2\left(\frac{X_a}{|Z_a|^2} + \frac{X_m}{R_m^2 + X_m^2}\right) \frac{X_m R_m}{(R_m^2 + X_m^2)^2}}{\left(\left(1 + Z_0\left(\frac{R_r}{|Z_a|^2} + \frac{R_m}{R_m^2 + X_m^2}\right)\right)^2 + Z_0^2\left(\frac{X_a}{|Z_a|^2} + \frac{X_m}{R_m^2 + X_m^2}\right)^2\right)^2}$$

$$= \frac{8 Z_0^2 R_r}{|Z_a|^4 |Z_m|^4} \cdot \frac{(|Z_a|^2 + Z_0 R_r)\left[R_m^2 + Z_0 \frac{|Z_a|^2 + 2 X_a X_m}{|Z_a|^2 + Z_0 R_r} R_m - X_m^2\right]}{\left(\left(1 + Z_0\left(\frac{R_r}{|Z_a|^2} + \frac{R_m}{R_m^2 + X_m^2}\right)\right)^2 + Z_0^2\left(\frac{X_a}{|Z_a|^2} + \frac{X_m}{R_m^2 + X_m^2}\right)^2\right)^2} \quad \text{[Formula 49]}$$

The terms of formula (49) that do not include the numerator are positive values, and hence the relationship between total efficiency $\eta_t$ and loss resistance $R_m$ of the matching element 420 may be described by investigating a behavior of the numerator in formula (49).

The numerator of formula (49) is a quadratic equation with respect to $R_m$. The coefficient of $R_m^2$ is a positive value and the numerator of formula (49) thus shows a downward-pointing convex parabola. In addition, when $R_m^2$ is 0, the value of the numerator of formula (49) becomes $-X_m^2$, a negative value.

FIG. 13 and FIG. 14 schematically illustrate a relationship between $R_m$ and $\partial \eta_t / \partial R_m$ and a relationship between $R_m$ and $\eta_t$, respectively.

$R_{m0}$ in FIG. 13 and FIG. 14 is the numerator of formula (49), i.e., the solution of a quadratic equation with respect to $R_m$, which is expressed by the following formula, (50).

$$R_{m0} = \frac{-Z_0(|Z_a|^2 + 2 X_a X_m) \pm \sqrt{Z_0^2(|Z_a|^2 + 2 X_a X_m)^2 + 4(|Z_a|^2 + Z_0 R_r)^2 X_m^2}}{2(|Z_a|^2 + Z_0 R_r)} \quad \text{[Formula 50]}$$

Referring to FIG. 14, when $R_m$ is smaller than $R_{m0}$, as $R_m$ becomes larger, total efficiency $\eta_t$ becomes worse. As $R_m$ becomes larger than $R_{m0}$, total efficiency $\eta_t$ improves.

However, loss resistance $R_m$ of a matching element actually selected as a matching element that forms the matching circuit 220 is less than $R_{m0}$.

Accordingly, in the case in which one matching element 420 is inserted in parallel as the matching circuit 220, as loss resistance $R_m$ of the matching element 420 becomes larger, total efficiency $\eta_t$ becomes worse.

As described above, in the case illustrated in FIG. 4 in which one matching element 420 is inserted in parallel as the matching circuit 220, as loss resistance $R_m$ of the matching element 420 increases, matching becomes worse in some situations and becomes better in other situations. Meanwhile, within the range of loss resistance $R_m$ of the matching element 420 actually selected as a matching element that forms the matching circuit 220, as loss resistance $R_m$ of the matching element 420 increases, radiation efficiency $\eta$ and total efficiency $\eta_t$ become worse even if matching becomes better.

Taking as examples a case in which one matching element 320 is inserted in series as the matching circuit 220 and a case in which one matching element 420 is inserted in parallel as the matching circuit 220, descriptions have been given of the relationship of loss resistance $R_m$ of a matching element with reflection coefficient $S_{11}$, radiation efficiency $\eta$, and total radiation efficiency $\eta_t$. However, the relationship of loss resistance $R_m$ of a matching element with reflection coefficient $S_{11}$, radiation efficiency $\eta$, and total radiation efficiency $\eta_t$ remains the same even if the circuit configuration and the number of matching elements that form the matching circuit 220 are changed.

That is, as loss resistance $R_m$ of a matching element increases, matching becomes worse in some situations and becomes better in other situations, but radiation efficiency $\eta$ and total reflection efficiency $\eta_t$ become worse.

As a result, when an antenna is designed in consideration of loss resistance $R_m$ of a matching element that forms a matching circuit, reflection coefficient $S_{11}$, which becomes worse in some situations and becomes better in other situations as loss resistance $R_m$ increases, is not suitable as a criterion for determining a matching element that forms a matching circuit. Thus, radiation efficiency $\eta$ or total radiation efficiency $\eta_t$ may be used as a criterion for determining a matching element that forms a matching circuit.

In an embodiment, the calculation result determining unit 132c determines whether or not an antenna model provided with a matching circuit satisfies a desired standard by using total efficiency $\eta_t$, which is a performance measure of the entire antenna model including the wave source 210, the matching circuit 220, and the antenna 230.

In particular, depending on an embodiment, the calculation result determining unit 132c determines whether or not total efficiency $\eta_t$ of an antenna model provided with a matching circuit and created by the antenna-model-with-matching-circuit creating unit 132a satisfies a desired standard value $\eta_r$. The desired standard value $\eta_r$ of total efficiency is obtained via, for example, an input by the input unit 110.

Depending on an embodiment, the calculation result determining unit 132c determines whether or not loss resistance of a matching element selected by the antenna-model-with-matching-circuit creating unit 132a satisfies an allowable upper limit obtained from the desired standard value $\eta_r$ of total efficiency.

As an example, in the case described with reference to FIG. 3 in which one matching element 320 is inserted in series as the matching circuit 220, total efficiency may be represented by formula (32). Accordingly, the allowable upper limit of loss resistance of a matching element which is obtained from the desired standard value $\eta_r$ of total efficiency is expressed by a value obtained by replacing $\eta_t$ in formula (32) with $\eta_r$ and by solving formula (32) with respect to loss resistance $R_m$.

As another example, in the case described with reference to FIG. 4 in which one matching element 420 is inserted in parallel as the matching circuit 220, total efficiency may be expressed by formula (48). Accordingly, the allowable upper limit of loss resistance of a matching element which is obtained from the desired standard value $\eta_r$ of total efficiency is expressed by a value obtained by replacing $\eta_t$ in formula (48) with $\eta_r$ and by solving formula (48) with respect to loss resistance $R_m$.

Depending on an embodiment, the calculation result determining unit 132c determines whether or not loss resistance $R_m$ of a matching element selected by the antenna-model-with-matching-circuit creating unit 132a satisfies a threshold of loss resistance $R_m$ of the matching element which is calculated according to total efficiency.

That is, since total efficiency becomes worse as loss resistance $R_m$ of a matching element increases as described above, a case could occur in which, when loss resistance $R_m$ exceeds a certain value, the total efficiency after incorporation of a matching element becomes worse than the total efficiency before incorporation of the matching element. Accordingly, the calculation result determining unit 132c sets as a threshold the value of loss resistance $R_m$ of a matching element in the case of the total efficiency after incorporation of a matching element becoming worse than the total efficiency before incorporation of the matching element, and the calculation result determining unit 132c determines whether or not loss resistance $R_m$ of a matching element selected by the antenna-model-with-matching-circuit creating unit 132a is smaller than the threshold that has been set.

As an example, in the case described with reference to FIG. 3 in which one matching element 320 is inserted in series as the matching circuit 220, the threshold of loss resistance $R_m$ of the matching element 320 may be set as follows.

First, assuming that the antenna 230 includes no loss, total efficiency $\eta_t$ of an antenna model not provided with the matching circuit 220 depends on mismatching only and thus may be expressed by the following formula, (51).

$$\eta_t = 1 - |S_{11}|^2 \qquad \text{[Formula 51]}$$
$$= 4Z_0 \frac{R_r}{(R_r + Z_0)^2 + X_a^2}$$

Meanwhile, total efficiency $\eta_t$ of an antenna model provided with the matching element 320 may be expressed by formula (32).

Accordingly, as indicated by the following formula, (52), a condition for improving total efficiency by achieving matching may be determined by comparing formula (32) with formula (51).

$$4Z_0 \frac{R_r}{(R_r + Z_0)^2 + X_a^2} < \qquad \text{[Formula 52]}$$
$$4Z_0 \frac{R_r}{R_m^2 + 2(R_r + Z_0)R_m + (R_r + Z_0)^2 + (X_a + X_m)^2}$$
$$X_a^2 > R_m^2 + 2(R_r + Z_0)R_m + (X_a + X_m)^2$$
$$0 > R_m^2 + 2(R_r + Z_0)R_m + 2X_a X_m + X_m^2$$

A condition for making formula (52) hold is as indicated by the following formula, (53).

$$R_m < -(R_r + Z_0) + \sqrt{(R_r + Z_0)^2 - 2X_a X_m - X_m^2} \qquad \text{[Formula 53]}$$

When $X_a<0$, formula (53) is expressed as indicated by the following formula, (54).

$$R_m < -(R_r+Z_0)+\sqrt{(R_r+Z_0)^2-4\pi fL(X_a+\pi fL)} \qquad \text{[Formula 54]}$$

When $X_a>0$, formula (53) is expressed as indicated by the following formula, (55).

$$R_m < -(R_r+Z_0)+\sqrt{(R_r+Z_0)^2+\frac{1}{\pi fC}\left(X_a-\frac{1}{4\pi fC}\right)} \qquad \text{[Formula 55]}$$

Accordingly, the threshold of loss resistance $R_m$ of the matching element 320 in the case of one matching element 320 being inserted in series as the matching circuit 220 may be obtained by formulae (54) and (55). That is, clarifying antenna impedance $Z_a$ in the absence of the matching circuit 220 and the value of the matching element 320 allows allowable loss resistance $R_m$ of the matching element 320 to be calculated.

Similarly, as an example, in the case described with reference to FIG. 4 in which one matching element 420 is inserted in parallel as the matching circuit 220, the threshold of loss resistance $R_m$ of the matching element 420 may be set as follows.

First, assuming that the antenna 230 includes no loss, total efficiency $\eta_t$ of an antenna model not provided with the matching circuit 220 depends on mismatching only and thus may be expressed by the following formula, (56).

$$\eta_t = 1-|S_{11}|^2 \qquad \text{[Formula 56]}$$
$$= 1-\frac{(R_r-Z_0)^2+X_a^2}{(R_r+Z_0)^2+X_a^2}$$
$$= \frac{4R_rZ_0}{(R_r+Z_0)^2+X_a^2}$$

Meanwhile, total efficiency $\eta_t$ of an antenna model provided with the matching element 420 may be expressed by formula (48).

Accordingly, as indicated by the following formula, (57), a condition for improving total efficiency by achieving matching may be determined by comparing formula (48) with formula (56).

$$\frac{4R_rZ_0}{(R_r+Z_0)^2+X_a^2} < \qquad \text{[Formula 57]}$$
$$\frac{R_r}{|Z_a|^2}\frac{4Z_0}{\left(1+Z_0\left(\frac{R_r}{|Z_a|^2}+\frac{R_m}{|Z_m|^2}\right)\right)^2+Z_0^2\left(\frac{X_a}{|Z_a|^2}+\frac{X_m}{|Z_m|^2}\right)^2}$$
$$R_m < -\frac{2X_aX_m+|Z_a|^2}{2\left(\frac{|Z_a|^2}{Z_0}+R_r\right)}$$

A condition for making loss resistance $R_m$ in formula (57) 0 ($R_m=0$) is indicated by the following formula, (58).

$$2X_aX_m < -|Z_a|^2 \qquad \text{[Formula 58]}$$

When the relational expression $X_m=-X_a$ holds in formula (58), i.e., when a reactance component of the antenna 230 can be completely cancelled, a condition for making loss resistance $R_m$ zero (0) ($R_m=0$) may be expressed as indicated by the following formula, (59).

$$R_r^2 < X_a^2 \qquad \text{[Formula 59]}$$

When $X_a<0$, formula (57) is expressed as indicated by the following formula, (60).

$$R_m < -\frac{4\pi X_a fL+|Z_a|^2}{2\left(\frac{|Z_a|^2}{Z_0}+R_r\right)} \qquad \text{[Formula 60]}$$

Meanwhile, when $X_a>0$, formula (57) is expressed as indicated by the following formula, (61).

$$R_m < \frac{\frac{X_a}{\pi}\frac{1}{fC}-|Z_a|^2}{2\left(\frac{|Z_a|^2}{Z_0}+R_r\right)} \qquad \text{[Formula 61]}$$

Accordingly, the threshold of loss resistance $R_m$ of the matching element 420 in the case of one matching element 420 being inserted in parallel as the matching circuit 220 may be obtained by formulae (60) and (61). That is, clarifying antenna impedance $Z_a$ in the absence of the matching circuit 220 and the value of the matching element 420 allows allowable loss resistance $R_m$ of the matching element 420 to be calculated.

As described above, using total efficiency, the calculation result determining unit 132c determines whether or not an antenna model provided with a matching circuit and further including resistance or inductance and parasitic reactance and loss resistance of a matching element satisfies a desired standard. As a result, in an antenna designing process in which loss resistance of a matching element is considered, it is possible to quickly and appropriately determine each matching element that forms a matching circuit connected to an antenna.

When the calculation result determining unit 132c determines that the antenna model provided with a matching circuit satisfies a desired standard, the calculation result determining unit 132c causes the display unit 140 to display the determination result. The calculation result determining unit 132c stores the determination result in the investigation result file 122.

Meanwhile, when the calculation result determining unit 132c determines that the antenna model provided with a matching circuit does not satisfy a desired standard, the calculation result determining unit 132c causes the display unit 140 to display power consumption for each matching element that forms the matching circuit 220. Depending on an embodiment, the calculation result determining unit 132c causes the display unit 140 to display an allowable upper limit or threshold of loss resistance of a matching element. As described above, power consumption of each matching element is calculated by the antenna characteristic calculating unit 132b and is stored in the investigation result file 122.

The calculation result determining unit 132c obtains a matching element with equal capacitance or inductance to but lower loss resistance than a matching element that forms the matching circuit 220, and replaces the matching element that forms the matching circuit 220 with the obtained matching element. Depending on an embodiment, the obtaining by the calculation result determining unit 132c is performed by referring to the matching element data file 123. Depending on an embodiment, the obtaining is performed by referring to element characteristic data of a matching element input by the input unit 110.

An antenna characteristic of an antenna model including a matching circuit for which a matching element has been replaced by the calculation result determining unit 132c is calculated by the antenna characteristic calculating unit 132b. After the antenna characteristic is calculated by the antenna characteristic calculating unit 132b, the calculation result determining unit 132c determines again whether or not the antenna model provided with a matching circuit including a matching element after the replacing satisfies a desired standard.

In this way, in an embodiment, each matching element that forms a matching circuit is determined via the calculation result determining unit 132c determining whether or not an antenna model provided with a matching circuit and further including parasitic reactance and loss resistance of a matching element satisfies a desired total efficiency.

Accordingly, in accordance with an embodiment, each matching element that forms a matching circuit may be determined quickly and efficiently, and a desired antenna may be designed efficiently in consideration of loss resistance of a matching element.

Descriptions will be given of an example of a process flow of a method for designing an antenna in accordance with an embodiment.

Figure 15:
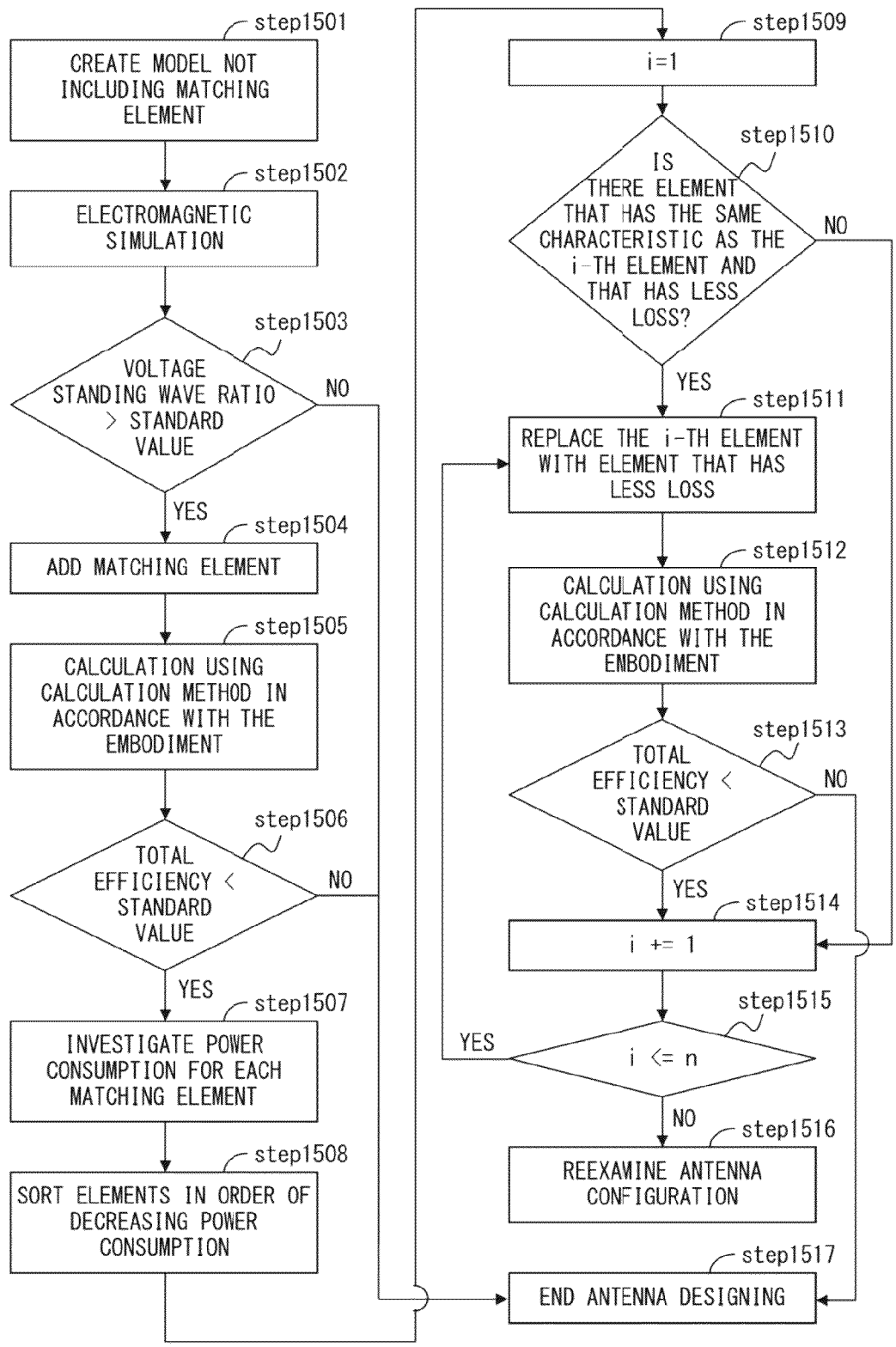
FIG. 15 is an exemplary diagram illustrating a process flow of a method for designing an antenna in accordance with an embodiment.

FIG. 15 is an exemplary diagram illustrating a process flow of a method for designing an antenna in accordance with an embodiment.

In step 1501, the antenna model creating unit 131a creates an antenna model that does not include a matching circuit in accordance with condition data of an antenna model input by the input unit 110. As described above, condition data of an antenna model input by the input unit 110 includes data relating to a shape of an antenna model, material for a model, a wave source, a circuit component, an analysis condition, and an analysis output item.

In step 1502, the simulation analyzing unit 131b obtains in a simulation an antenna characteristic of the antenna model created by the antenna model creating unit 131a. The antenna characteristics obtained via the analyzing by the simulation unit 131b include radiation efficiency $\eta_a$, antenna impedance $Z_0$, and a reflection coefficient $S_{11}$ for each frequency which is set via an input by the input unit 110. These antenna characteristics are stored in the analysis result file 121.

In step 1503, the simulation result determining unit 131c determines whether or not a voltage standing wave ratio obtained from an analysis result of the simulation analyzing unit 131b is equal to or less than a desired standard value.

When it is determined in step 1503 that the voltage standing wave ratio is equal to or less than the desired standard value, the antenna designing process proceeds to step 1517, where the antenna designing ends. Then, on the basis of the antenna model created by the antenna model creating unit 131a, an antenna is manufactured or experimentally produced.

When it is determined in step 1503 that the voltage standing wave ratio exceeds the desired standard value, the antenna designing process proceeds to step 1504.

In step 1504, the antenna-model-with-matching-circuit creating unit 132a imports radiation efficiency $\eta_a$, antenna impedance $Z_0$, and reflection coefficient $S_{11}$ for each subject frequency stored in the analysis result file 121.

The display unit 140 displays a tool screen for creating and analyzing an antenna model provided with a matching circuit.

Figure 16:
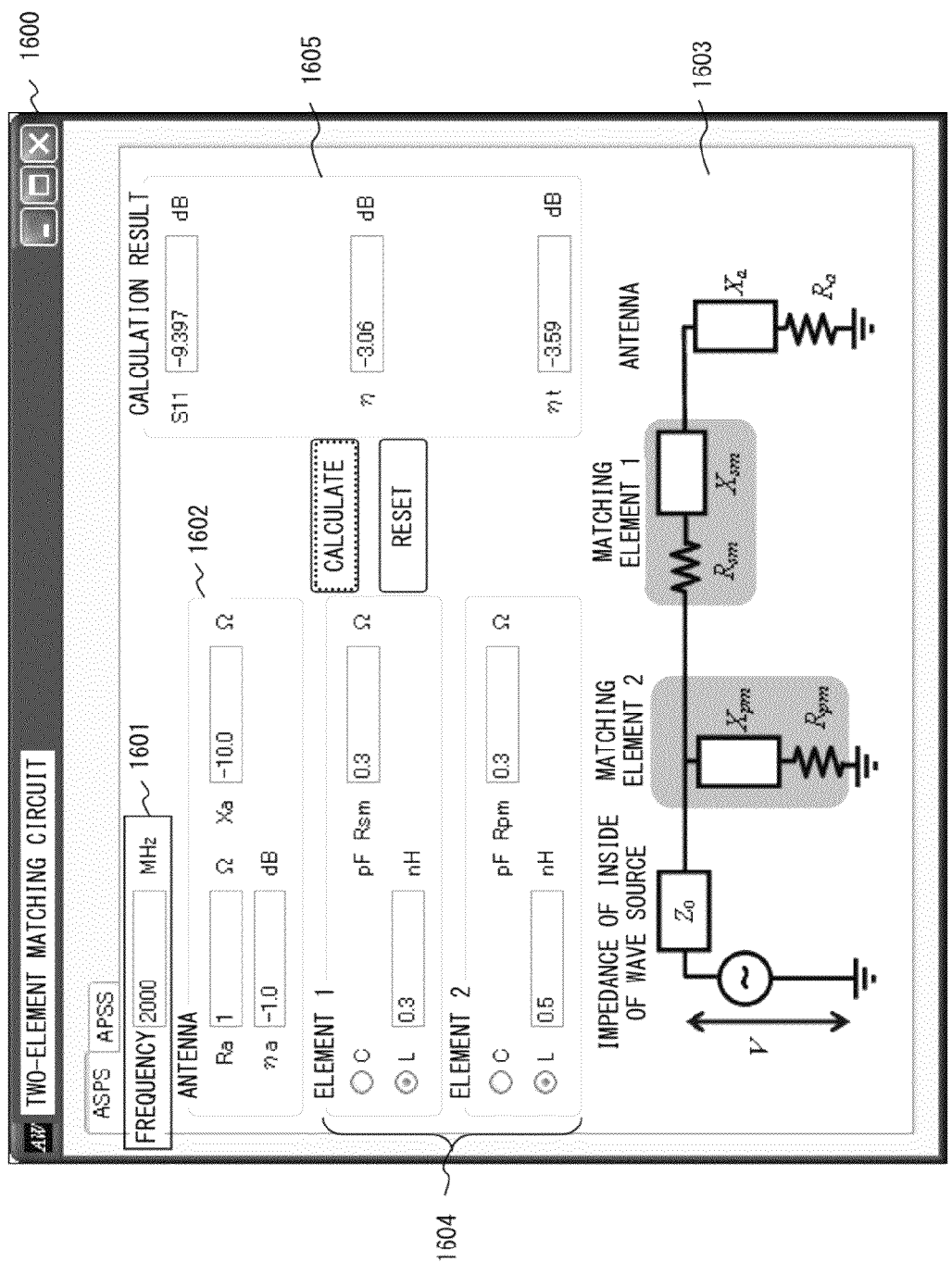
FIG. 16 illustrates an example of a tool screen for creating and analyzing an antenna model provided with a matching circuit.

FIG. 16 illustrates an example of a tool screen for creating and analyzing an antenna model provided with a matching circuit.

As illustrated in FIG. 16, a tool screen 1600 in accordance with an embodiment includes a region 1601 for displaying a subject frequency and a region 1602 for displaying a real part $R_a$ and an imaginary part $X_a$ of antenna impedance and radiation efficiency $\eta_a$ before providing a matching circuit.

When a subject frequency is input by the input unit 110, the display unit 140 causes a real part $R_a$ and an imaginary part $X_a$ of the antenna impedance and the radiation efficiency $\eta_a$ before providing a matching circuit for the subject frequency imported by the antenna-model-with-matching-circuit creating unit 132a to be displayed within the regions 1601 and 1602. Alternatively, the display unit 140 causes the subject frequency input by the input unit 110, the real part $R_a$ and the imaginary part $X_a$ of the antenna impedance, and the radiation efficiency $\eta_a$ before providing a matching circuit to be displayed in the regions 1601 and 1602.

The antenna-model-with-matching-circuit creating unit 132a calculates a circuit configuration of a desired matching circuit according to the imported reflection coefficient $S_{11}$. Alternatively, the antenna-model-with-matching-circuit creating unit 132a obtains data on a circuit configuration of a matching circuit which is input by the input unit 110.

As illustrated in FIG. 16, the circuit configuration of a matching circuit calculated or obtained by the antenna-model-with-matching-circuit creating unit 132a is caused by the display unit 140 to be displayed within a region 1603 for displaying an equivalent circuit of an antenna model provided with a matching circuit.

In accordance with the calculated or obtained circuit configuration, the antenna-model-with-matching-circuit creating unit 132a determines a matching element that forms a matching circuit and that conforms to a use condition. Via an input from the input unit 110, a use condition for using a matching element is obtained by the antenna-model-with-matching-circuit creating unit 132a.

Depending on an embodiment, the antenna-model-with-matching-circuit creating unit 132a determines a matching element that forms a matching circuit by referring to data on a matching element stored in the matching element data file 123.

Figure 18:
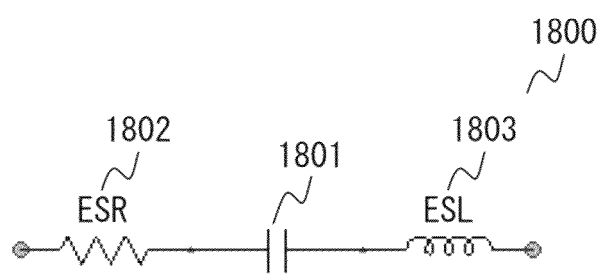
FIG. 18 is an equivalent circuit diagram of a capacitor including parasitic reactance and loss resistance.
Figure 20:
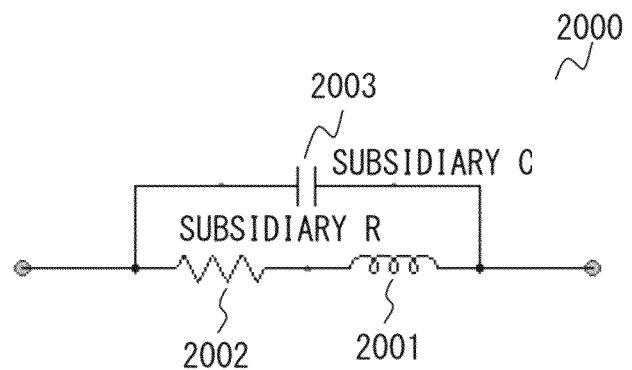
FIG. 20 is an equivalent circuit diagram of an inductor including parasitic reactance and loss resistance.

FIG. 17 illustrates an example of a matching element data file in a situation in which the kind of a matching element is a capacitor. FIG. 18 is an equivalent circuit diagram of a capacitor including parasitic reactance and loss resistance. FIG. 19 illustrates an example of a matching element data file in a situation in which the kind of a matching element is an inductor. FIG. 20 is an equivalent circuit diagram of an inductor including parasitic reactance and loss resistance.

As illustrated in FIG. 17, when the type of a matching element is a capacitor, a matching element data file 1700 includes data relating to a matching element name 1701, a maker name 1702, a size 1703, capacitance 1704, equivalent series inductance (ESL) 1705, equivalent series resistance (ESR) 1706, a pressure resistance 1707, and a price 1708.

As illustrated in FIG. 18, when the type of a matching element is a capacitor, a capacitor 1800 includes a capacitance component 1801 as well as an equivalent series resistance component 1802, a loss resistance component, and an equivalent series inductance component 1803, a parasitic reactance component. In an embodiment, an antenna characteristic of an antenna model provided with a matching circuit is calculated by considering equivalent series inductance and equivalent series resistance in addition to a capacitance component of an electrostatic element. Accordingly, data relating to equivalent series inductance and equivalent series resistance is stored in the matching element data file 1700.

As illustrated in FIG. 19, when the type of a matching element is an inductor, a matching element data file 1900 includes data relating to a matching element name 1901, a maker name 1902, a size 1903, an inductance 1904, subsidiary capacitance 1905, subsidiary resistance 1906, a pressure resistance 1907, and a price 1908.

As illustrated in FIG. 20, when the type of a matching element is an inductor, an inductor 2000 includes an inductance component 2001 as well as a subsidiary resistance component 2002, a loss resistance component, and a subsidiary capacitance component 2003, a parasitic reactance component. In an embodiment, an antenna characteristic of an antenna model provided with a matching circuit is calculated by considering a subsidiary capacitance component and a subsidiary resistance component in addition to an inductance component of an inductor. Accordingly, data relating to subsidiary capacitance and subsidiary resistance is stored in the matching element data file 1900.

To determine a matching element by referring to the matching element data file 123, the antenna-model-with-matching-circuit creating unit 132*a* first rearranges the matching element data file 123 in an ascending or descending order of capacitance or inductance. When there are matching elements with the same capacitance or inductance, the antenna-model-with-matching-circuit creating unit 132*a* rearranges the matching element data file 123 in an ascending or descending order of the prices of the matching elements. The antenna-model-with-matching-circuit creating unit 132*a* selects from the matching element data file 123 a matching element with a size and a pressure resistance, both of which conform to a use condition for using a matching element. When the matching element data file 123 includes matching elements with the same size and the same pressure resistance, the antenna-model-with-matching-circuit creating unit 132*a* selects a lower priced matching element.

Once the antenna-model-with-matching-circuit creating unit 132*a* determines an antenna element that forms a matching circuit in accordance with the matching element data file 123, the type, capacitance or inductance, loss resistance, and parasitic reactance of the determined matching element are displayed within a region 1604 of the tool screen 1600.

Depending on an embodiment, the type, capacitance or inductance, loss resistance, and parasitic reactance of a matching element input by the input unit 110 are displayed within the region 1604 of the tool screen 1600. In this case, according to data on a matching element input by the input unit 110, the antenna-model-with-matching-circuit creating unit 132*a* determines a matching element that conforms to a use condition.

The antenna-model-with-matching-circuit creating unit 132*a* obtains equivalent series inductance or subsidiary capacitance, parasitic reactance of the determined matching element, and equivalent series resistance or subsidiary resistance, loss resistance.

Depending on an embodiment, parasitic inductance or parasitic capacitance and equivalent series resistance or subsidiary resistance are obtained by referring to the matching element data file 123. Depending on an embodiment, parasitic inductance or parasitic capacitance of a matching element and equivalent series resistance or subsidiary resistance are obtained via an input by the input unit 110.

In step 1505, in accordance with the calculation technique described with reference to FIG. 3 to FIG. 8, the antenna characteristic calculating unit 132*b* calculates antenna characteristics of an antenna model determined by the antenna-model-with-matching-circuit creating unit 132*a* and including the matching element that forms a matching circuit. The calculated antenna characteristics include radiation efficiency $\eta$, total efficiency $\eta_t$, reflection coefficient $S_{11}$, and power consumption for each matching element that forms a matching circuit. These antenna characteristics are stored in the investigation result file 122.

As illustrated in FIG. 16, the display unit 140 causes a region 1605 within the tool screen 1600 to display radiation efficiency $\eta$, total efficiency $\eta_t$, and reflection coefficient $S_{11}$ of an antenna model provided with a matching circuit, all of which are calculated by the antenna characteristic calculating unit 132*b*.

In step 1506, the calculation result determining unit 132*c* determines whether or not total efficiency $\eta_t$ calculated by the antenna characteristic calculating unit 132*b* is equal to or greater than a desired standard value.

When it is determined in step 1506 that total efficiency $\eta_t$ is equal to or greater than the desired standard value, the antenna designing process proceeds to step 1517, where the antenna designing ends. Then, according to the antenna model created by the antenna-model-with-matching-circuit creating unit 132*a*, an antenna is manufactured or experimentally produced.

When it is determined in step 1506 that total efficiency $\eta_t$ is less than the desired standard value, the antenna designing process proceeds to step 1507.

In step 1507, the calculation result determining unit 132*c* causes the display unit 140 to display, for each matching element that forms a matching circuit, power consumption data stored by the investigation result file 122. Depending on an embodiment, a printing apparatus (not illustrated) connected to the antenna designing apparatus 100 prints power consumption for each matching element that forms a matching circuit.

Figure 21:
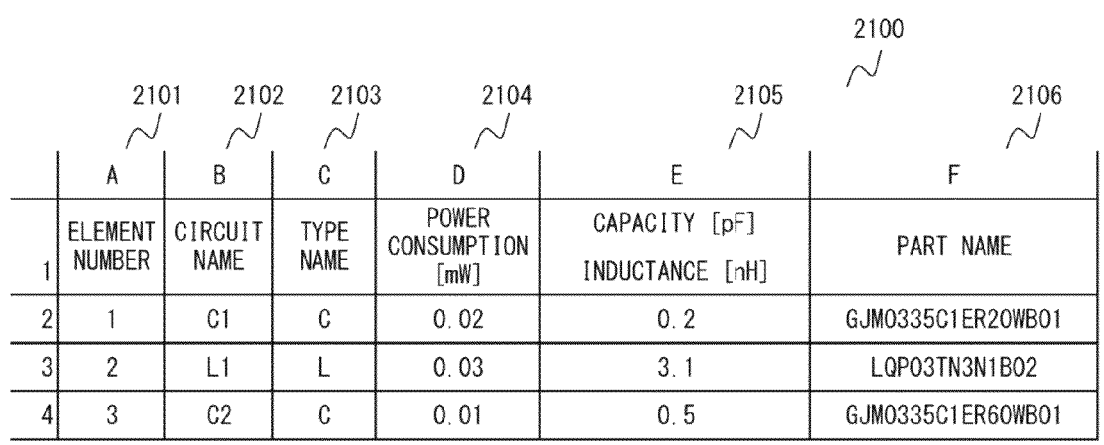
FIG. 21 illustrates a display example of power consumption data provided by a display unit for each matching element forming a matching circuit.

FIG. 21 illustrates a display example of power consumption data provided by a display unit for each matching element that forms a matching circuit.

As illustrated in FIG. 21, power consumption data 2100 for each matching element that forms a matching circuit includes element number 2101, circuit name 2012, type 2103, power consumption 2104, capacitance or inductance 2105, and part name 2106.

In step 1508, the calculation result determining unit 132*c* rearranges power consumption data 2100 of matching elements in order of decreasing power consumption 2104. The calculation result determining unit 132*c* then reassigns, in an ascending order, element numbers 2101 of the matching elements that have been rearranged in order of power consumption.

Figure 22:
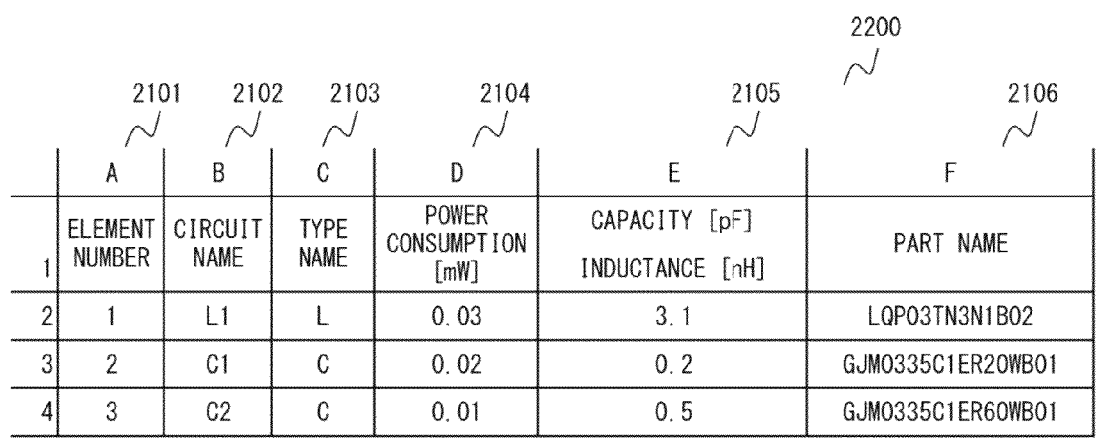
FIG. 22 illustrates an example of power consumption data of matching elements which are ordered in order of decreasing power consumption.

FIG. 22 illustrates an example of power consumption data of matching elements which are ordered in order of decreasing power consumption. As is clear from the comparison with FIG. 21, in power consumption data 2200 of matching elements illustrated in FIG. 22, matching elements are rearranged in order of decreasing power consumption 2104, and element numbers 2101 are assigned to the rearranged matching elements in an ascending order.

In step 1509, the calculation result determining unit 132*c* sets count value i of element number 2101 to 1. In step 1510, the calculation result determining unit 132*c* searches for a matching element that has the same capacitance or inductance as that of a matching element with the i-th count value of element number 2101 and that has a smaller loss resistance. Depending on an embodiment, the calculation result determining unit 132*c* searches for a corresponding matching element in the matching element data file 123.

When there is a corresponding matching element in step 1510, the process proceeds to step 1511.

In step 1511, the antenna model creating unit 132a replaces the matching element that forms a matching circuit and that corresponds to the i-th count value with the matching element that is obtained by the calculation result determining unit 132c, that has the same capacitance or inductance as that of the matching element above corresponding to the i-th count value, and that has smaller loss resistance.

In step 1512, using the calculation method in accordance with the aforementioned embodiment, the antenna characteristic calculating unit 132b calculates an antenna characteristic of an antenna model including the matching circuit after the antenna model creating unit 132a replaces a matching element.

In step 1513, the calculation result determining unit 132c determines whether or not total efficiency $\eta_t$ of the antenna model including the matching circuit after the replacing of a matching element is equal to or greater than a desired standard value.

When it is determined in step 1513 that total efficiency $\eta_t$ of the antenna model including the matching circuit after the replacing of a matching element is equal to or greater than the desired standard value, the antenna designing process proceeds to step 1517, where the antenna designing ends. Then, according to the antenna model that is created by the antenna-model-with-matching-circuit creating unit 132a and that is provided with the matching circuit after the replacing of a matching element, an antenna is manufactured or experimentally produced.

When it is determined in step 1513 that total efficiency $\eta_t$ of the antenna model including the matching circuit after the replacing of a matching element is less than the desired standard value, the antenna designing process proceeds to step 1514.

When there is no corresponding matching element in step 1510, the antenna designing process proceeds to step 1514.

In step 1514, the calculation result determining unit 132c increments count value i by one. In step 1515, it is determined whether or not count value i is equal to or lower than n, the number of matching elements that form a matching circuit.

When it is determined in step 1515 that count value is equal to or less than n, which is the number of matching elements that form a matching circuit, the process returns to step 1511, where the antenna designing process continues.

When it is determined in step 1515 that count value exceeds the number of matching elements that form a matching circuit n, the antenna designing process proceeds to step 1516, where the calculation result determining unit 132c causes the display unit 140 to provide a display indicating that the antenna model needs to be reconfigured.

Depending on an embodiment, the antenna designing process after step 1516 returns to step 1501, where condition data of an antenna model input by the input unit 110 is changed, and the antenna designing process in accordance with the embodiment is performed again. Depending on an embodiment, the process returns to step 1504, where a use condition for using a matching element, such as the size of the matching element, is changed, and the antenna designing process in accordance with the embodiment is performed again.

The antenna designing process flow described with reference to FIG. 15 is mere an example, and hence it is not intended that embodiments be limited to this. As an example, the described antenna designing process flow may include the following changes.

First, in step 1501 of the antenna designing process flow, the input unit 110 inputs, in addition to the aforementioned various pieces of data, data relating to a circuit configuration of a matching circuit as condition data of an antenna model.

In step 1504, in accordance with the data input by the input unit 110 and relating to a circuit configuration of a matching circuit, the antenna-model-with-matching-circuit creating unit 132a creates a model of a matching circuit formed by a matching element that does not include a parasitic reactance component and a loss resistance component. The antenna-model-with-matching-circuit creating unit 132a then causes the simulation analyzing unit 131b to perform simulation analyzing for the created antenna model provided with a matching circuit and obtains an optimum circuit constant.

In accordance with the circuit constant obtained via the analyzing by the simulation analyzing unit 131b, the antenna-model-with-matching-circuit creating unit 132a determines a matching element that forms a matching circuit. Depending on an embodiment, the antenna-model-with-matching-circuit creating unit 132a determines a matching element by referring to the matching element data file. Depending on an embodiment, the antenna-model-with-matching-circuit creating unit 132a determines a matching element according to data on a matching element input from the input unit 110.

In step 1505, using the calculation method in accordance with the aforementioned embodiment, the antenna characteristic calculating unit 132b calculates an antenna characteristic of an antenna model including the matching circuit formed by the matching element determined by the antenna-model-with-matching-circuit creating unit 132a.

In the aforementioned embodiments, the antenna designing method used by the antenna designing apparatus 100 was described. However, the described components and processing facilities of the antenna designing apparatus 100 may be achieved by an antenna designing program, a piece of software. Accordingly, an antenna designing process similar to that performed by the antenna designing apparatus 100 may be achieved by a computer that executes the antenna designing program.

FIG. 23 is a hardware configuration diagram of a computer that executes an antenna designing program in accordance with an embodiment.

As illustrated in FIG. 23, a computer 2300 includes an input apparatus 2301, a reading apparatus 2302, a communication interface 2303, a hard disk (HDD) 2304, a central processing unit (CPU) 2305, a random access memory (RAM) 2306, a read only memory (ROM) 2307, a display apparatus 2308, and a bus 2309. The apparatuses 2301 to 2308 included in the computer 2300 are mutually connected via the bus 2309.

The input apparatus 2301 detects an operation performed by a user of the computer 2300, and the input apparatus 2301 is, for example, a mouse and a keyboard.

The reading apparatus 2302 reads a program and data included in variable record media such as a magnetic disk, an optical disk, and a magneto-optical disk, and the reading apparatus 2302 is, for example, a compact disc/digital versatile disc (CD/DVD) drive. The communication interface 2303 is an interface for connecting the computer 2300 to a communication network such as a local area network (LAN). The HDD 2304 is a storage apparatus that stores a program and data executed by the CPU 2305.

An antenna designing program in accordance with an embodiment is installed in the HDD 2304 via the reading apparatus 2302 reading the antenna designing program recorded by a variable record medium. Alternatively, an antenna designing program in accordance with an embodiment is installed in the HDD 2304 via the computer 2300 obtaining the antenna designing program stored in another computer apparatus (not illustrated) by using the communication interface 2303.

The CPU 2305 is a processing apparatus that performs an antenna designing process in accordance with an embodiment by executing an antenna designing program by reading this program from the HDD 2304 and loading this read program into the RAM 2306.

The RAM 2306 stores a prior-to-completion result of an antenna designing program read from the HDD 2304. The ROM 2307 stores, for example, constant data.

The display apparatus 2308 displays, for example, a processing result of the CPU 2305, and the display apparatus 2308 is, for example, a liquid crystal display apparatus.

As described above, in an embodiment, when an antenna model provided with a matching circuit is created, an antenna model that is provided with a matching element and that includes capacitance or inductance of a matching element as well as parasitic reactance and loss resistance of the matching element is created. Values including parasitic reactance and loss resistance of a matching element that forms the created matching circuit are obtained from the matching element data file or specified by an input from the input unit. That is, in accordance with an embodiment, when an antenna designing process is performed, models of parasitic reactance and loss resistance do not need to be individually created in addition to capacitance or inductance of each matching element that forms a matching circuit, and those values do not need to be individually set. As a result, it is possible to quickly and readily perform a process for designing an antenna provided with a matching circuit and further including parasitic reactance and loss resistance of the matching element.

In an embodiment, using an antenna characteristic of an antenna model that does not include a matching circuit and without performing a simulation, an antenna characteristic of an antenna model provided with a matching circuit and further including parasitic reactance and loss resistance of a matching element is calculated. Accordingly, it is possible to obtain in a short time an antenna characteristic of an antenna model provided with a matching circuit and further including parasitic reactance and loss resistance of a matching element, thereby enabling a desired antenna to be designed efficiently.

Moreover, in an embodiment, in accordance with whether or not desired total efficiency is satisfied by an antenna model which is provided with a matching circuit and for which loss resistance of a matching element is considered, each matching element that forms the matching circuit is determined. As a result, it is possible to quickly and appropriately determine each matching element that forms a matching circuit connected to an antenna, enabling an antenna designing process to be efficiently performed in consideration of loss resistance of a matching element.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An antenna designing method performed by a computer, the antenna designing method comprising:
   inputting a first antenna characteristic of an antenna;
   creating an antenna model that includes the antenna and a matching circuit which is connected to the antenna and is formed by a matching element including parasitic reactance and loss resistance;
   calculating a second antenna characteristic of the created antenna model by using the first antenna characteristic;
   determining whether or not the calculated second antenna characteristic satisfies a desired standard value; and
   displaying a determined result, wherein
   the matching element that forms the matching circuit is selected by referring to a matching element data file including data relating to a use condition for using the matching element.

2. An antenna designing method performed by a computer, the antenna designing method comprising:
   inputting a first antenna characteristic of an antenna;
   creating an antenna model that includes the antenna and a matching circuit which is connected to the antenna and is formed by a matching element including parasitic reactance and loss resistance;
   calculating a second antenna characteristic of the created antenna model by using the first antenna characteristic;
   determining whether or not the calculated second antenna characteristic satisfies a desired standard value; and
   displaying a determined result, wherein
   when it is determined that the second antenna characteristic does not satisfy the desired standard value, an allowable upper limit of the loss resistance of the matching element that forms the matching circuit is displayed.

3. The antenna designing method according to claim 2, wherein
   the determination whether or not the calculated second antenna characteristic satisfies the desired standard value is made by determining whether or not a total efficiency is equal to or greater than a desired standard value, the total efficiency indicating a ratio between an input electric power to the antenna model and a radiated power from the antenna model.

4. The antenna designing method according to claim 2, wherein
   the first antenna characteristic is obtained by performing an electromagnetic simulation.

5. An antenna designing method performed by a computer, the antenna designing method comprising:
   inputting first antenna characteristics of an antenna;
   creating an antenna model that includes the antenna and a matching circuit which is connected to the antenna and is formed by a matching element including parasitic reactance and loss resistance;
   calculating second antenna characteristics of the created antenna model by using the first antenna characteristics;
   determining whether or not each of the calculated second antenna characteristics satisfies a desired standard value; and
   displaying a determined result, wherein
   the second antenna characteristics includes power consumption of the matching element, and
   the power consumption of the matching element is displayed.

6. An antenna designing apparatus comprising:
   an input unit configured to input a first antenna characteristic of an antenna;
   an antenna-with-matching-circuit creating unit configured to create an antenna model that includes the antenna and a matching circuit which is connected to the antenna and is formed by a matching element including parasitic reactance and loss resistance;
   an antenna characteristic calculating unit configured to calculate, by using the first antenna characteristic, a second antenna characteristic of the antenna model created by the antenna-with-matching-circuit creating unit;
a calculation result determining unit configured to determine whether or not the second antenna characteristic calculated by the antenna characteristic calculating unit satisfies a desired standard value; and
a display unit configured to display a result determined by the calculation result determining unit, wherein
when it is determined, by the calculation result determining unit, that the second antenna characteristic does not satisfy the desired standard value, an allowable upper limit of the loss resistance of the matching element that forms the matching circuit is displayed by the display unit.

7. A non-transitory computer-readable recording medium having stored therein a program for causing a computer to execute an antenna designing process comprising:
inputting a first antenna characteristic of an antenna;
creating an antenna model that includes the antenna and a matching circuit which is connected to the antenna and is formed by a matching element including parasitic reactance and loss resistance;
calculating a second antenna characteristic of the created antenna model by using the first antenna characteristic;
determining whether or not the calculated second antenna characteristic satisfies a desired standard value; and
displaying a determined result, wherein
when it is determined that the second antenna characteristic does not satisfy the desired standard value, an allowable upper limit of the loss resistance of the matching element that forms the matching circuit is displayed.

* * * * *